US012787560B2

(12) United States Patent
Zhang et al.

(10) Patent No.: US 12,787,560 B2
(45) Date of Patent: Nov. 3, 2026

(54) DISPLAY SUBSTRATE AND DISPLAY APPARATUS

(71) Applicants: CHENGDU BOE OPTOELECTRONICS TECHNOLOGY CO., LTD., Chengdu (CN); BOE TECHNOLOGY GROUP CO., LTD., Beijing (CN); BEIJING BOE TECHNOLOGY DEVELOPMENT CO., LTD., Beijing (CN)

(72) Inventors: Wei Zhang, Beijing (CN); Ming Hu, Beijing (CN); Haijun Qiu, Beijing (CN); Xiangdan Dong, Beijing (CN); Yi Zhang, Beijing (CN); Zhiliang Jiang, Beijing (CN); Rui Wang, Beijing (CN); Taofeng Xie, Beijing (CN); Hai Zheng, Beijing (CN); Fengli Ji, Beijing (CN); Haigang Qing, Beijing (CN); Gukhwan Song, Beijing (CN); Tingliang Liu, Beijing (CN); Yu Wang, Beijing (CN); Cong Fan, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 261 days.

(21) Appl. No.: 18/709,692

(22) PCT Filed: Apr. 25, 2023

(86) PCT No.: PCT/CN2023/090559
§ 371 (c)(1),
(2) Date: May 13, 2024

(87) PCT Pub. No.: WO2024/221215
PCT Pub. Date: Oct. 31, 2024

(65) Prior Publication Data
US 2025/0031526 A1 Jan. 23, 2025

(51) Int. Cl.
*H10K 59/122* (2023.01)

(52) U.S. Cl.
CPC .................................. *H10K 59/122* (2023.02)

(58) Field of Classification Search
CPC ........................... H10K 59/122; H10K 59/353
See application file for complete search history.

(56) References Cited

U.S. PATENT DOCUMENTS 8,475,937 B2 7/2013 Suzuki et al.
2017/0069697 A1 3/2017 Hashimoto et al.
(Continued)

FOREIGN PATENT DOCUMENTS

CN 105895664 A 8/2016
CN 114628405 A 6/2022
(Continued)

OTHER PUBLICATIONS

First Office Action of a related U.S. Appl. No. 18/547,647, dated Feb. 5, 2026.
(Continued)

*Primary Examiner* — Eric A. Ward
(74) *Attorney, Agent, or Firm* — Chiwin Law LLC

(57) ABSTRACT

A display substrate and a display apparatus are provided. The display substrate includes sub-pixels, a pixel defining pattern, and a defining structure. The sub-pixel includes a light-emitting functional layer. The pixel defining pattern includes first openings and second openings, a portion in the defining structure exposed by the second opening is config-
(Continued)

ured to isolate the light-emitting functional layer. The sub-pixels include a first sub-pixel and a second sub-pixel, a turn-on voltage of the first sub-pixel is higher than that of the second sub-pixel; the defining structure includes a first defining structure surrounding the second sub-pixel and a second defining structure surrounding the second sub-pixel; the first defining structure is not exposed by the second opening; or a proportion of the first defining structure exposed by the second opening is less than a proportion of the second defining structure exposed by the second opening.

20 Claims, 11 Drawing Sheets

(56) References Cited

U.S. PATENT DOCUMENTS

| | | | |
|---|---|---|---|
| 2017/0278905 A1 | 9/2017 | Hsu et al. | |
| 2018/0123078 A1 | 5/2018 | Byun et al. | |
| 2020/0235172 A1 | 7/2020 | Lee et al. | |
| 2021/0359028 A1 | 11/2021 | Asaoka et al. | |
| 2021/0408163 A1 | 12/2021 | Heo et al. | |
| 2022/0085125 A1* | 3/2022 | Yun | H10K 59/122 |
| 2022/0093721 A1 | 3/2022 | Kim et al. | |
| 2023/0059253 A1* | 2/2023 | Baek | H10K 59/80521 |
| 2023/0309348 A1 | 9/2023 | Kwon et al. | |

FOREIGN PATENT DOCUMENTS

| | | |
|---|---|---|
| CN | 114628448 A | 6/2022 |
| CN | 114628451 A | 6/2022 |
| CN | 216749902 U | 6/2022 |
| CN | 115241266 A | 10/2022 |
| CN | 113314579 B | 11/2022 |
| CN | 115513273 A | 12/2022 |
| JP | 2005197189 A | 7/2025 |

OTHER PUBLICATIONS

Extended European Search Report of a related European application EP22966081.6.

First Office Action of a related U.S. Appl. No. 18/705,758, dated Jun. 18, 2026.

* cited by examiner

DISPLAY SUBSTRATE AND DISPLAY APPARATUS

CROSS-REFERENCE TO RELATED APPLICATION

This application is a U.S. National Phase Entry of International Application No. PCT/CN2023/090559 filed on Apr. 25, 2023, designating the United States of America. The present application claims priority to and the benefit of the above-identified application and the above-identified application is incorporated by reference herein in its entirety.

TECHNICAL FIELD

Embodiments of the present disclosure relate to a display substrate and a display apparatus.

BACKGROUND

Organic light-emitting diode (OLED) display products have advantages such as rich colors, fast response time, and foldability. With the development of display technology, users have increasingly high requirements for service life and power consumption of display apparatuses. A tandem organic light-emitting display device, by adding at least one light-emitting layer and a charge generation layer in the organic light-emitting device, increases service life and brightness of the light-emitting device and reduces power consumption, so as to meet the users' requirements for service life and power consumption of the display apparatus.

SUMMARY

Embodiments of the present disclosure provide a display substrate and a display apparatus.

At least one embodiment of the present disclosure provides a display substrate, which includes: a base substrate, and a plurality of sub-pixels, a pixel defining pattern and a defining structure located on the base substrate. The base substrate includes at least including a first region; the plurality of sub-pixels is located in the first region, each sub-pixel among at least some sub-pixels includes a light-emitting functional layer, and the light-emitting functional layer includes a plurality of film layers; the pixel defining pattern, includes a plurality of first openings to define light-emitting regions of the at least some sub-pixels; the defining structure is located between the light-emitting functional layer and the base substrate, the defining structure includes a portion surrounding a light-emitting region of each sub-pixel among the at least some sub-pixels. The pixel defining pattern further includes second openings, a portion of at least one layer in the light-emitting functional layer that is located in the first opening is a continuous portion, at least a portion of the at least one layer in the light-emitting functional layer that is located in at least one second opening is isolated, and a portion in the defining structure that is exposed by the second opening is configured to isolate the at least one layer of the light-emitting functional layer; the plurality of sub-pixels includes a first sub-pixel and a second sub-pixel, a turn-on voltage of the first sub-pixel is higher than a turn-on voltage of the second sub-pixel, the defining structure includes a first defining structure and a second defining structure, the first defining structure at least includes a portion surrounding a light-emitting region of the first sub-pixel, and the second defining structure at least includes a portion surrounding a light-emitting region of the second sub-pixel; the first defining structure is not exposed by the second opening, or a proportion of an edge length of a portion in the first defining structure that is exposed by the second opening to a perimeter of the first opening corresponding to the first sub-pixel is less than a proportion of an edge length of a portion in the second defining structure that is exposed by the second opening to a perimeter of the first opening corresponding to the second sub-pixel.

For example, according to an embodiment of the present disclosure, the turn-on voltage of the first sub-pixel is 0.1 V to 5 V higher than the turn-on voltage of the second sub-pixel.

For example, according to an embodiment of the present disclosure, a portion of the second defining structure that is exposed by the second opening is a non-closed ring structure, and a proportion of the non-closed ring structure to the perimeter of the first opening corresponding to the second sub-pixel ranges from 10% to 80%.

For example, according to an embodiment of the present disclosure, the plurality of sub-pixels further includes a third sub-pixel, the defining structure further includes a third defining structure, the third defining structure includes a portion surrounding a light-emitting region of the third sub-pixel; the third defining structure is not exposed by the second opening, or the proportion of the edge length of the portion in the first defining structure that is exposed by the second opening to the perimeter of the first opening corresponding to the first sub-pixel is less than a proportion of an edge length of a portion in the third defining structure that is exposed by the second opening to a perimeter of the first opening corresponding to the third sub-pixel.

For example, according to an embodiment of the present disclosure, the portion of the third defining structure that is exposed by the second opening is a non-closed ring structure, and a proportion of the non-closed ring structure to the perimeter of the first opening corresponding to the third sub-pixel ranges from 10% to 80%.

For example, according to an embodiment of the present disclosure, the first sub-pixel is a blue sub-pixel, one of the second sub-pixel and the third sub-pixel is a red sub-pixel, and the other of the second sub-pixel and the third sub-pixel is a green sub-pixel.

For example, according to an embodiment of the present disclosure, each sub-pixel among the at least some sub-pixels further includes a first electrode and a second electrode located on both sides of the light-emitting functional layer along a direction perpendicular to the base substrate, the first electrode is located between the light-emitting functional layer and the base substrate, and the pixel defining pattern is located on a side of the first electrode away from the base substrate; the defining structure is located between the first electrode and the base substrate.

For example, according to an embodiment of the present disclosure, the pixel defining pattern includes a pixel defining portion surrounding the first opening and the second opening; along a direction perpendicular to the base substrate, at least a portion of the pixel defining portion does not overlap with the defining structure.

For example, according to an embodiment of the present disclosure, each sub-pixel among the at least some sub-pixels further includes a first electrode and a second electrode located on both sides of the light-emitting functional layer along a direction perpendicular to the base substrate, the first electrode is located between the light-emitting functional layer and the base substrate, and the pixel defining pattern is located on a side of the first electrode away from the base substrate; the first defining structure is not exposed by the second opening, a ring width of a ring portion of the first defining structure that is not covered by the first electrode of the first sub-pixel is less than a ring width of a ring portion of the second defining structure that is not covered by the first electrode of the second sub-pixel.

For example, according to an embodiment of the present disclosure, each sub-pixel among the at least some sub-pixels further includes a first electrode and a second electrode located on both sides of the light-emitting functional layer along a direction perpendicular to the base substrate, the first electrode is located between the light-emitting functional layer and the base substrate, and the pixel defining pattern is located on a side of the first electrode away from the base substrate; the proportion of the edge length of the portion in the first defining structure that is exposed by the second opening to the perimeter of the first opening corresponding to the first sub-pixel is less than the proportion of the edge length of the portion in the second defining structure that is exposed by the second opening to the perimeter of the first opening corresponding to the second sub-pixel; a ring width of a portion having no overlapping portion with the second opening in a ring portion of the first defining structure that is not covered by the first electrode of the first sub-pixel is a first ring width, a ring width of a portion having an overlapping portion with the second opening in the ring portion of the first defining structure is a second ring width, and the first ring width is less than the second ring width.

For example, according to an embodiment of the present disclosure, each sub-pixel among the at least some sub-pixels further includes a first electrode and a second electrode located on both sides of the light-emitting functional layer along a direction perpendicular to the base substrate, the first electrode is located between the light-emitting functional layer and the base substrate, and the pixel defining pattern is located on a side of the first electrode away from the base substrate; the base substrate further includes a second region, the defining structure includes at least one loop of annular defining structure that is closed around the second region, and the light-emitting functional layer and the second electrode are both disconnected in an edge position of the annular defining structure.

For example, according to an embodiment of the present disclosure, the pixel defining pattern includes a pixel defining portion surrounding the first opening and the second opening, and along the direction perpendicular to the base substrate, at least a portion of the annular defining structure does not overlap with the pixel defining portion.

For example, according to an embodiment of the present disclosure, the at least one loop of closed annular defining structure includes a plurality of loops of annular defining structures, and an interval between two adjacent loops of annular defining structures is no less than 1 micron.

For example, according to an embodiment of the present disclosure, the defining structure includes a first isolation layer and a second isolation layer stacked, the first isolation layer is located on a side of the second isolation layer away from the base substrate, and an edge of the first isolation layer protrudes relative to an edge of the second isolation layer.

For example, according to an embodiment of the present disclosure, a material of the first isolation layer is different from a material of the second isolation layer, the material of the first isolation layer includes an inorganic non-metallic material or a metallic material, and the material of the second isolation layer includes an organic material or an inorganic non-metallic material.

For example, according to an embodiment of the present disclosure, the plurality of sub-pixels further includes a third sub-pixel; the plurality of sub-pixels is arranged into a plurality of first sub-pixel groups and a plurality of second sub-pixel groups arranged alternately along a first direction; the respective first sub-pixel groups each include first sub-pixels and second sub-pixels arranged alternately along a second direction, the respective second sub-pixel groups each include third sub-pixels arranged along the second direction; and the first direction intersects with the second direction.

For example, according to an embodiment of the present disclosure, the defining structure further includes a third defining structure; the first defining structure includes a non-closed ring first isolation portion surrounding the light-emitting region of the first sub-pixel, the second defining structure includes a non-closed ring second isolation portion surrounding the light-emitting region of the second sub-pixel, and the third defining structure includes a non-closed ring third isolation portion surrounding the light-emitting region of the third sub-pixel; shapes of the light-emitting regions of the first sub-pixel, the second sub-pixel, and the third sub-pixel are all quadrilaterals; the first isolation portion surrounds two adjacent edges of the light-emitting region of the first sub-pixel and a first corner portion formed by connecting the two adjacent edges, or the first isolation portion surrounds a portion of two adjacent edges of the light-emitting region of the first sub-pixel except a first corner portion formed by connecting the two adjacent edges; the second isolation portion surrounds two adjacent edges of the light-emitting region of the second sub-pixel and a second corner portion formed by connecting the two adjacent edges; the third isolation portion surrounds two adjacent edges of the light-emitting region of the third sub-pixel and a third corner portion formed by connecting the two adjacent edges; and orientations of the first corner portion, the second corner portion, and the third corner portion are all the same.

For example, according to an embodiment of the present disclosure, the second defining structure includes a non-closed ring second isolation portion surrounding the light-emitting region of the second sub-pixel; shapes of the light-emitting regions of the first sub-pixel, the second sub-pixel, and the third sub-pixel are all quadrilaterals, and the second isolation portion surrounds four edges of the light-emitting region of the second sub-pixel.

For example, according to an embodiment of the present disclosure, the defining structure further includes a third defining structure, the third defining structure includes a non-closed ring third isolation portion surrounding the light-emitting region of the third sub-pixel, and the third isolation portion surrounds two edges of the light-emitting region of the third sub-pixel that are closely adjacent to the light-emitting region of the first sub-pixel.

For example, according to an embodiment of the present disclosure, the second defining structure includes a non-closed ring second isolation portion surrounding the light-emitting region of the second sub-pixel; the defining structure further includes a third defining structure, and the third defining structure includes a non-closed ring third isolation portion surrounding the light-emitting region of the third sub-pixel; shapes of the light-emitting regions of the first sub-pixel, the second sub-pixel, and the third sub-pixel are all quadrilaterals; the second isolation portion surrounds two adjacent edges of the light-emitting region of the second sub-pixel and a second corner portion formed by connecting the two adjacent edges, the third isolation portion surrounds two adjacent edges of the light-emitting region of the third sub-pixel and a third corner portion formed by connecting the two adjacent edges; and orientations of the second corner portion and the third corner portion are both the same.

For example, according to an embodiment of the present disclosure, at least one film layer of the light-emitting functional layer includes a charge generation layer, the light-emitting functional layer includes a first light-emitting layer, the charge generation layer, and a second light-emitting layer stacked; the charge generation layer is located between the first light-emitting layer and the second light-emitting layer, and the charge generation layer is disconnected at an edge of the defining structure.

An embodiment of the present disclosure provides a display substrate, which includes a base substrate, and a plurality of sub-pixels, a pixel defining pattern and a defining structure located on the base substrate. The base substrate at least includes a first region; the plurality of sub-pixels are located in the first region, each sub-pixel among at least some sub-pixels includes a light-emitting functional layer, and the light-emitting functional layer includes a plurality of film layers; the pixel defining pattern is located on the base substrate, the pixel defining pattern includes a plurality of first openings to define light-emitting regions of the at least some sub-pixels; the defining structure are located between the light-emitting functional layer and the base substrate, the defining structure includes a portion surrounding a light-emitting region of each sub-pixel among the at least some sub-pixels. The pixel defining pattern further includes second openings, a portion of at least one layer in the light-emitting functional layer that is located in the first opening is a continuous portion, at least a portion of the at least one layer in the light-emitting functional layer that is located in at least one second opening is isolated, and a portion in the defining structure that is exposed by the second opening is configured to isolate the at least one layer of the light-emitting functional layer; the plurality of sub-pixels includes a first sub-pixel and a second sub-pixel, a turn-on voltage of the first sub-pixel is higher than a turn-on voltage of the second sub-pixel; a distance between an edge of a light-emitting region of the first sub-pixel and a second opening closest to the edge of the light-emitting region of the first sub-pixel is a first distance, a distance between an edge of a light-emitting region of the second sub-pixel and a second opening closely adjacent to the edge of the light-emitting region of the second sub-pixel is a second distance, and the first distance is greater than the second distance; or, the defining structure includes a first defining structure and a second defining structure, the first defining structure at least includes a portion surrounding the light-emitting region of the first sub-pixel, and the second defining structure at least includes a portion surrounding the light-emitting region of the second sub-pixel; a proportion of an edge length of a portion in the first defining structure that is exposed by the second opening to a perimeter of the first opening corresponding to the first sub-pixel is less than a proportion of an edge length of a portion in the second defining structure that is exposed by the second opening to a perimeter of the first opening corresponding to the second sub-pixel.

For example, according to an embodiment of the present disclosure, the turn-on voltage of the first sub-pixel is 0.1 V to 5 V higher than the turn-on voltage of the second sub-pixel.

For example, according to an embodiment of the present disclosure, the plurality of sub-pixels further includes a third sub-pixel, the second opening is provided between the first sub-pixel and the third sub-pixel, a distance between the edge of the light-emitting region of the first sub-pixel and the second opening is a third distance, a distance between the edge of the light-emitting region of the third sub-pixel and the second opening is a fourth distance, and the third distance is greater than the fourth distance; or, the defining structure further includes a third defining structure, the third defining structure includes a portion surrounding the light-emitting region of the third sub-pixel; the proportion of the edge length of the portion in the first defining structure that is exposed by the second opening to the perimeter of the first opening corresponding to the first sub-pixel is less than a proportion of an edge length of a portion in the third defining structure that is exposed by the second opening to a perimeter of the first opening corresponding to the third sub-pixel.

For example, according to an embodiment of the present disclosure, a portion of the second defining structure that is exposed by the second opening is a non-closed ring structure, and a proportion of the non-closed ring structure to the perimeter of the first opening corresponding to the second sub-pixel ranges from 10% to 80%.

For example, according to an embodiment of the present disclosure, a portion of the third defining structure that is exposed by the second opening is a non-closed ring structure, and a proportion of the non-closed ring structure to the perimeter of the first opening corresponding to the third sub-pixel ranges from 10% to 80%.

For example, according to an embodiment of the present disclosure, each sub-pixel among the at least some sub-pixels further includes a first electrode and a second electrode located on both sides of the light-emitting functional layer along a direction perpendicular to the base substrate, the first electrode is located between the light-emitting functional layer and the base substrate, and the pixel defining pattern is located on a side of the first electrode away from the base substrate; the base substrate further includes a second region, the defining structure includes at least one loop of annular defining structure that is closed around the second region, and the light-emitting functional layer and the second electrode are both disconnected in an edge position of the annular defining structure.

An embodiment of the present disclosure provides a display apparatus, including the display substrate in any of the above embodiments.

BRIEF DESCRIPTION OF DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

Figure 1:
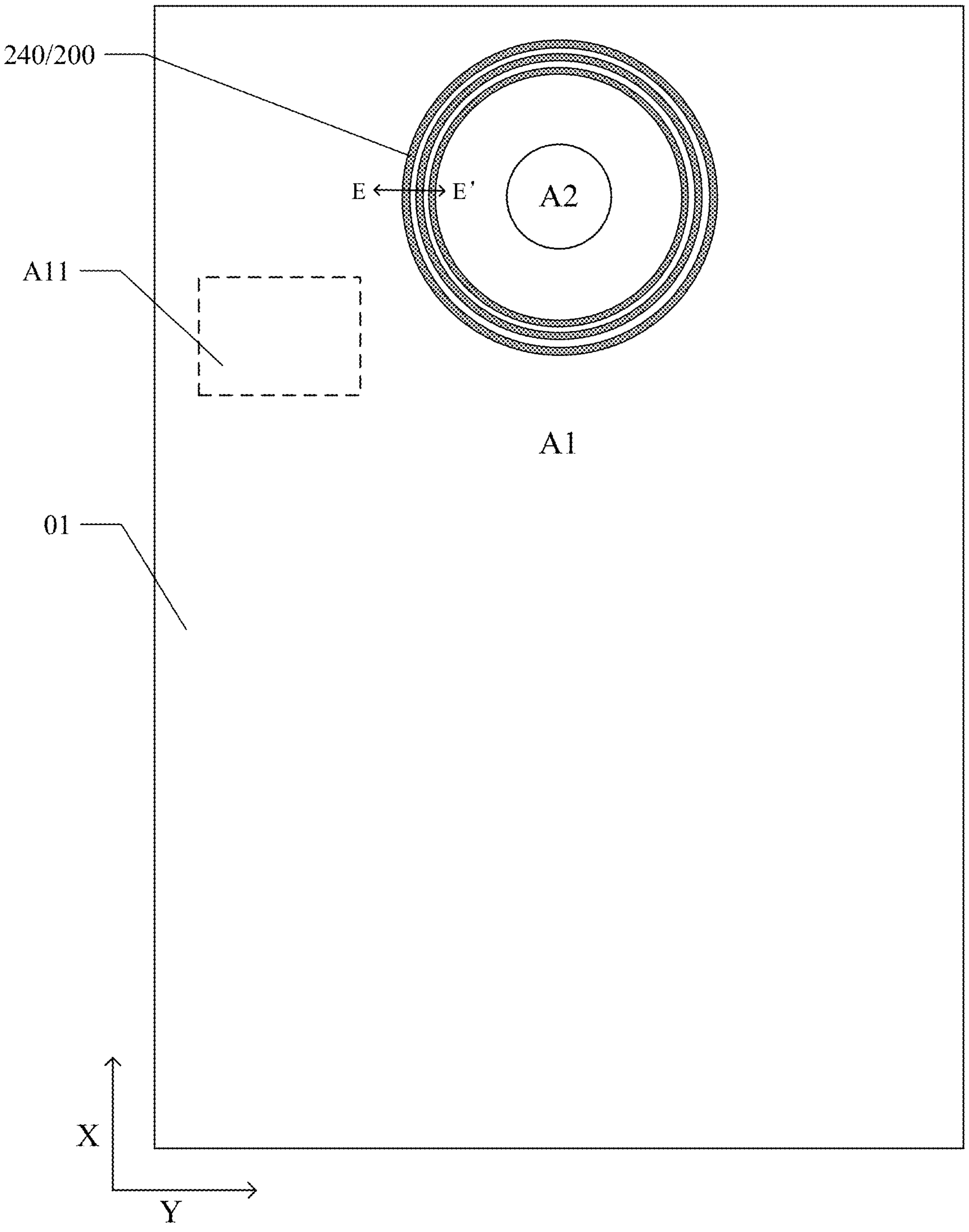
FIG. 1 is a plan view of a display substrate provided by an example according to an embodiment of the present disclosure.

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects.

Features such as "parallel", "perpendicular" and "identical", etc. used in the embodiments of the present disclosure all include strictly defined features such as "parallel", "perpendicular" and "identical", as well as cases where certain errors are included such as "substantially parallel", "substantially perpendicular" and "substantially identical", considering that errors related to measurement and measurement of a specific quantity (e.g., limitations of a measurement system) indicate that such features are within an acceptable deviation range for a specific value determined by those ordinarily skilled in the art. For example, the expression "substantially" may indicate that features are within one or more standard deviations, or within 10% or 5% of a value. When a quantity of a component is not specifically specified in the following text of the embodiments of the present disclosure, it means that the quantity of such component may be one or more, or may be understood as at least one. The expression "at least one" refers to one or more, and "more" refers to at least two.

The "integrated structure" according to the present disclosure refers to a structure formed of two (or more) structures connected with each other patterned by using a same deposition process and a same patterning process, in which the two structures may be made of a same material or different materials.

In the study, an inventor of the present application finds that a light-emitting functional layer of a light-emitting element may include a plurality of light-emitting layers stacked, for example, a tandem device; the tandem device has characteristics of low power consumption and long service life. However, a charge generation layer (CGL) is arranged between at least two layers among the plurality of light-emitting layer of the tandem device, and the charge generation layer has higher conductivity. For example, when the charge generation layer is a whole-face film layer, charge generation layers of two adjacent light-emitting elements are continuous films, and there is a charge lateral transfer phenomenon, which leads to the monochrome chromaticity shift of the display substrate at low gray scale, for example, crosstalk between adjacent sub-pixels is easily caused, so that color cast occurs to the display substrate. For example, the charge generation layer may easily lead to crosstalk between sub-pixels with different colors at low brightness, resulting in low-grayscale color cast.

The embodiments of the present disclosure provide a display substrate and a display apparatus. The display substrate includes a base substrate as well as a plurality of sub-pixels, a pixel defining pattern, and a defining structure located on the base substrate. The base substrate at least includes a first region; the plurality of sub-pixels is located in the first region, each sub-pixel among at least some sub-pixels includes a light-emitting functional layer, and the light-emitting functional layer includes a plurality of film layers. The pixel defining pattern is located on the base substrate, the pixel defining pattern includes a plurality of first openings to define light-emitting regions of the at least some sub-pixels; the defining structure is located between the light-emitting functional layer and the base substrate, and the light-emitting functional layer includes a portion surrounding a light-emitting region of each sub-pixel among the at least some sub-pixels. The pixel defining pattern further includes a second opening, a portion of at least one layer in the light-emitting functional layer that is located in the first opening is a continuous portion, at least a portion of at least one layer in the light-emitting functional layer that is located in at least one second opening is isolated; and a portion in the defining structure that is exposed by the second opening is configured to isolate the at least one layer of the light-emitting functional layer. The plurality of sub-pixels include a first sub-pixel and a second sub-pixel, a turn-on voltage of the first sub-pixel is higher than a turn-on voltage of the second sub-pixel; the defining structure includes a first defining structure and a second defining structure, the first defining structure at least includes a portion surrounding a light-emitting region the first sub-pixel, the second defining structure at least includes a portion surrounding a light-emitting region of the second sub-pixel; the first defining structure is not exposed by the second opening; or a proportion of a length of an edge in the first defining structure that is exposed by the second opening to a perimeter of a first opening corresponding to the first sub-pixel is less than a proportion of a length of an edge in the second defining structure that is exposed by the second opening to a perimeter of a first opening corresponding to the second sub-pixel.

In the display substrate provided by the present disclosure, the first defining structure in the periphery of the first sub-pixel with a higher turn-on voltage is set to be not exposed by the second opening or to have less portion exposed by the second opening, the second electrode of the first sub-pixel has a conduction channel with a larger area, which improves a conductive effect of the second electrode of the first sub-pixel, and is favorable for avoiding excessive power consumption and brightness uniformity problems of the display substrate.

Hereinafter, the display substrate and the display apparatus provided by the embodiments of the present disclosure will be described in conjunction with the accompanying drawings.

Figure 2:
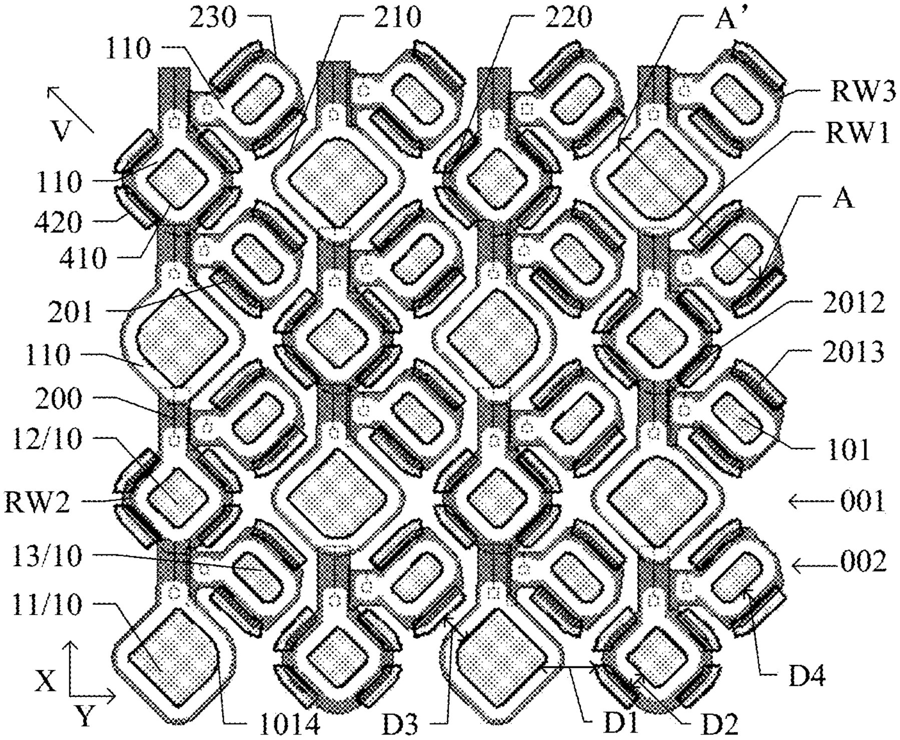
FIG. 2 is a structural diagram of an A11 region of the display substrate shown in FIG. 1 in an example.
Figure 3:
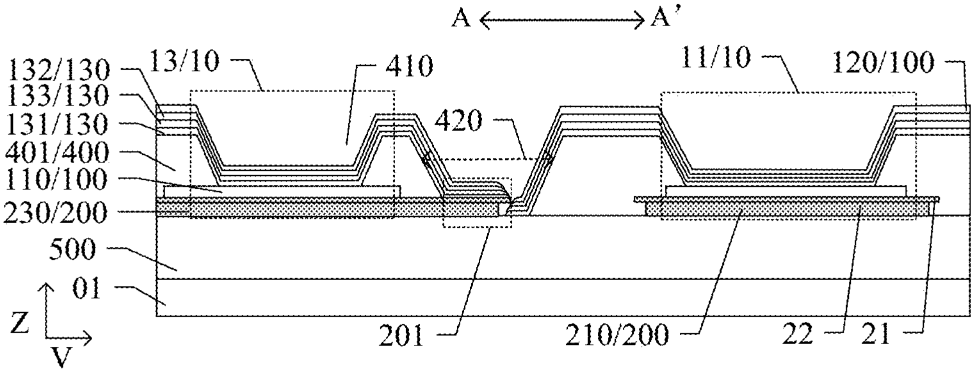
FIG. 3 is a schematic diagram of a partial cross-sectional structure sectioned along an AA' line shown in FIG. 2.

FIG. 1 is a plan view of a display substrate provided by an embodiment of the present disclosure. FIG. 2 is a structural diagram of an A11 region of a display substrate shown in FIG. 1 in an example. FIG. 3 is a schematic diagram of a partial cross-sectional structure sectioned along an AA' line shown in FIG. 2. FIG. 2 shows a first electrode of a light-emitting element, but does not show a second electrode of the light-emitting element.

As shown in FIG. 1 to FIG. 3, the display substrate includes a base substrate 01, as well as a plurality of sub-pixels 10, a pixel defining pattern 400, and a defining structure 200 located on the base substrate 01. The base substrate 01 at least includes a first region A1; the plurality of sub-pixels 10 is located in the first region A1, each sub-pixel 10 among the at least some sub-pixels 10 includes a light-emitting functional layer 130, and the light-emitting functional layer 130 includes a plurality of film layers.

For example, the sub-pixel 10 includes a light-emitting element 100, the light-emitting element 100 includes a light-emitting functional layer 130 as well as a first electrode 110 and a second electrode 120 located on both sides of the light-emitting functional layer 130 in a direction perpendicular to the base substrate 01, and the first electrode 110 is located between the light-emitting functional layer 130 and the base substrate 01. For example, the light-emitting functional layer 130 includes a charge generation layer 133. For example, the light-emitting element 100 may be an organic light-emitting element. For example, the display substrate includes a display region; the first region includes the display region, and each sub-pixel located in the display region includes a light-emitting element.

For example, as shown in FIG. 3, the light-emitting functional layer 130 may include a first light-emitting layer (EML) 131, a charge generation layer (CGL) 133, and a second light-emitting layer (EML) 132 stacked, and the charge generation layer 133 is located between the first light-emitting layer 131 and the second light-emitting layer 132. The charge generation layer has strong conductivity, and may allow the light-emitting functional layer to have advantages of long service life, low power consumption, and high brightness. For example, as compared with a light-emitting functional layer without a charge generation layer, the sub-pixels may have light emission brightness increased by nearly twice by arranging a charge generation layer in the light-emitting functional layer.

For example, the light-emitting element 100 of a same sub-pixel 10 may be a tandem light-emitting element, for example, a tandem OLED.

For example, the charge generation layer 133 may include an N-type charge generation layer and a P-type charge generation layer.

For example, among the respective sub-pixels 10, the light-emitting functional layer 130 may further include a hole injection layer (HIL), a hole transport layer (HTL), an electron transport layer (ETL) and an electron injection layer (EIL), etc.

For example, the hole injection layer, the hole transport layer, the electron transport layer and the electron injection layer, as well as the charge generation layer 133 are all shared film layers of the plurality of sub-pixels 10, and may be referred to as common layers. For example, the at least one film layer in the light-emitting functional layer 130 that is disconnected at an edge of the defining structure 200 may be at least one film layer in the above-described common layers. At least one layer in the above-described common layer is disconnected at an edge of the defining structure 200 located between adjacent sub-pixels, which may be favorable for reducing probability of crosstalk between adjacent sub-pixels. For example, the above-described common layers and the second electrode may be film layers formed by using an open mask.

For example, the second light-emitting layer 132 may be located between the first light-emitting layer 131 and the second electrode 120, and the hole injection layer may be located between the first electrode 110 and the first light-emitting layer 131. For example, the electron transport layer may also be provided between the charge generation layer 133 and the first light-emitting layer 131. For example, the hole transport layer may be provided between the second light-emitting layer 132 and the charge generation layer 133. For example, the electron transport layer and the electron injection layer may be provided between the second light-emitting layer 132 and the second electrode 120.

For example, in a same sub-pixel 10, the first light-emitting layer 131 and the second light-emitting layer 132 may be light-emitting layers emitting light of a same color. For example, in sub-pixels 10 emitting light of different colors, first light-emitting layers 131 emit light of different colors. For example, in sub-pixels 10 emitting light of different colors, second light-emitting layers 132 emit light of different colors. Of course, the embodiment of the present disclosure is not limited thereto, for example, in a same sub-pixel 10, the first light-emitting layer 131 and the second light-emitting layer 132 may be light-emitting layers emitting light of different colors; by setting light-emitting layers emitting light of different colors in the same sub-pixel 10, light emitted by a plurality of light-emitting layers included in the sub-pixel 10 may be mixed into white light, and color of emergent light from each sub-pixel may be adjusted by setting a color filter layer.

For example, a material of the electron transport layer may include aromatic heterocyclic compounds, for example, imidazole derivatives such as benzimidazole derivatives, imidazolium pyridine derivatives, benzimidazole phenanthridine derivatives, etc.; zine derivatives such as pyrimidine derivatives, triazine derivatives, etc.; compounds containing nitrogen-containing six-membered ring structures (also including compounds having substitution groups of phosphine oxide series on heterocycles) such as quinoline derivatives, isoquinoline derivatives, phenanthroline derivatives, etc.

For example, the charge generation layer 133 may be made of a material containing phosphorus oxide groups or a material containing triazine.

For example, a ratio of electron mobility of the material of the charge generation layer 133 to electron mobility of the electron transport layer is $10^{-2}$ to $10^{2}$.

For example, the first electrode 110 may be an anode, and the second electrode 120 may be a cathode. For example, the cathode may be made of a material with high conductivity and low power function, for example, the cathode may be made of a metal material. For example, the anode may be made of a transparent conductive material having a high power function.

For example, as shown in FIG. 3, an orthographic projection of second electrodes 120 in at least some sub-pixels 10 on the base substrate 01 is a whole-face structure. For example, the second electrode 120 may be a common electrode shared by the first sub-pixel 11 and the second sub-pixel 12. For example, the second electrode 120 may be a common electrode shared by the above-described at least some sub-pixels 10.

For example, as shown in FIG. 3, an insulation layer 500 is provided between the first electrode 110 and the base substrate 01. In FIG. 3, other structures between the insulation layer 500 and the base substrate 01, for example, a film layer where signal lines such as gate lines and data lines are located, as well as other insulation layers, are omitted.

As shown in FIG. 1 to FIG. 3, the pixel defining pattern 400 is located on a side of the first electrode 110 away from the base substrate 01, the pixel defining pattern 400 includes a plurality of first openings 410 to define light-emitting regions 101 of the at least some sub-pixels 10. For example, one sub-pixel 10 corresponds to at least one first opening 410, the light-emitting element 100 of the sub-pixel 10 is at least partially located in the first opening 410 corresponding to the sub-pixel 10, and the first opening 410 is configured to expose the first electrode 110. For example, the first opening 410 exposes a portion of the first electrode 110. For example, one sub-pixel 10 may correspond to one first opening 410.

For example, as shown in FIG. 2 and FIG. 3, when the light-emitting functional layer 130 is formed in the first opening 410 of the pixel defining pattern 400, the first electrode 110 and the second electrode 120 located on both sides of the light-emitting functional layer 130 are capable of driving the light-emitting functional layer 130 in the first opening 410 to emit light. For example, the above-described light-emitting region may refer to a region where sub-pixels effectively emit light; and a shape of the light-emitting region refers to a two-dimensional shape, for example, the shape of the light-emitting region may be the same as a shape of the first opening 410 of the pixel defining pattern 400.

For example, as shown in FIG. 3, the pixel defining pattern 400 includes a pixel defining portion 401 surrounding the first opening 410; and a material of the pixel defining portion 401 may include polyimide, acrylic, or polyethylene terephthalate, etc. For example, the pixel defining portion 401 included in the pixel defining pattern 400 covers a portion of the first electrode 110.

As shown in FIG. 2 and FIG. 3, the defining structure 200 is located between the light-emitting functional layer 130 and the base substrate 01, the defining structure 200 includes a portion surrounding the light-emitting region 11 of each sub-pixel 10 among the at least some sub-pixels 10. For example, two adjacent sub-pixels 10 arranged along a X direction, a Y direction, or a V direction are a first color sub-pixel and a second color sub-pixel, respectively; the defining structure 200 includes a portion surrounding a light-emitting region of the first color sub-pixel; an edge of the portion of the defining structure is substantially parallel to a boundary of the light-emitting region of the first color sub-pixel; and distances between more than 90% of positions in the portion and the boundary of the light-emitting region of the first color sub-pixel are all equal, for example, all are first spacing distances; a distance between the edge of the portion of the defining structure and the boundary of the light-emitting region of the second color sub-pixel is a second spacing distance, and the first spacing distance is smaller than the second spacing distance.

In some examples, as shown in FIG. 2 and FIG. 3, the defining structure 200 is located between the first electrode 110 and the base substrate 01.

For example, as shown in FIG. 3, an orthographic projection of the first opening 410 on the base substrate 01 is completely located within an orthographic projection of the defining structure 200 on the base substrate 01. For example, an orthographic projection of the first electrode 110 on the base substrate 01 is completely located within the orthographic projection of the defining structure 200 on the base substrate 01.

As shown in FIG. 2 to FIG. 3, the pixel defining pattern 400 further includes a second opening 420, a portion of the at least one layer in the light-emitting functional layer 130 that is located in the first opening 410 is a continuous portion; at least a portion of the at least one layer in the light-emitting functional layer located in at least one second opening 420 is isolated; and a portion in the defining structure 200 that is exposed by the second opening 420 is configured to isolate the at least one layer of the light-emitting functional layer 130. For example, the charge generation layer 133 in the light-emitting functional layer 130 is continuously arranged in the first opening 410 and disconnected in at least one second opening 420.

For example, as shown in FIG. 2 to FIG. 3, the portion in the defining structure 200 that is exposed by the second opening 420 includes an isolation portion 201, the isolation portion 201 is provided between at least two adjacent sub-pixels 10, and at least one layer in the light-emitting functional layer 130 is disconnected at an edge of the isolation portion 201. By setting the isolation portion between adjacent sub-pixels to isolate the at least one layer in the light-emitting functional layer, it is favorable for reducing crosstalk between adjacent sub-pixels. For example, the above-described isolation portion refers to a structure in the defining structure that is exposed by the second opening.

In any embodiment of the present disclosure, "adjacent sub-pixels" refer to two sub-pixels without any other sub-pixel arranged between them. The adjacent sub-pixels may be two sub-pixels with a same color or two sub-pixels with different colors.

For example, as shown in FIG. 3, at least a portion of the second electrode 120 is disconnected at the edge of the isolation portion 201.

In some examples, as shown in FIG. 3, the defining structure 200, for example, the isolation portion 201, includes a first isolation layer 21 and a second isolation layer 22 stacked, the first isolation layer 21 is located on a side of the second isolation layer 22 away from the base substrate 01, and an edge of the first isolation layer 21 protrudes relative to an edge of the second isolation layer 22. For example, a size by which the edge of the second isolation layer 22 shrinks inwards relative to the edge of the first isolation layer 21 is no less than 0.05 microns, for example, no less than 0.08 microns, for example, no less than 0.1 microns, for example, no less than 0.15 microns, for example, no less than 0.2 microns, for example, no less than 0.5 microns.

The edge of the defining structure is set to have the edge of the first isolation layer protrude relative to the edge of the second isolation layer, so as to isolate at least one layer of the light-emitting functional layer.

For example, as shown in FIG. 3, a thickness of the defining structure 200 may be greater than 100 angstroms. For example, the thickness of the defining structure 200 may be 150 angstroms to 5,000 angstroms. For example, the thickness of the defining structure 200 may be 200 angstroms to 500 angstroms. For example, the thickness of the defining structure 200 may be 300 angstroms to 1,000 angstroms. For example, the thickness of the defining structure 200 may be 400 angstroms to 2,000 angstroms. For example, the thickness of the defining structure 200 may be 600 angstroms and 1,500 angstroms.

In some examples, as shown in FIG. 3, a material of the first isolation layer 21 is different from a material of the second isolation layer 22. The material of the first isolation layer 21 includes an inorganic non-metallic material or a metallic material, while the material of the second isolation layer 22 includes an organic material or an inorganic non-metallic material.

For example, etch selectivity of an etching solution to the material of the second isolation layer 22 is greater than etch selectivity of an etching solution to the material of the first isolation layer 21, so that the edge of the second isolation layer 22 formed after etching shrinks inwards relative to the edge of the first isolation layer 21.

For example, the material of the first isolation layer 21 may include silicon nitride or silicon oxide. For example, the material of the second isolation layer 22 may include materials such as polyimide.

Of course, the embodiment of the present disclosure is not limited to that the defining structure includes two layers of structure stacked, and may also include three layers of structure stacked; in which a layer of structure farthest away from the base substrate protrudes relative to an edge of a middle layer of structure to implement the isolation of the light-emitting functional layer, for example, a layer of structure closest to the base substrate may also protrude relative to the edge of the middle layer of structure; or, the isolation portion may only include one layer of structure, and the edge of the structure has a protruding portion for isolate the light-emitting functional layer.

For example, as shown in FIG. 2, along the V direction, a size of one first opening 410 may be larger than a size of one second opening 420 extending along a direction intersecting with the V direction.

In some examples, as shown in FIG. 2 and FIG. 3, the pixel defining pattern 400 includes a pixel defining portion 401 surrounding the first opening 410 and the second opening 420; in the direction perpendicular to the base substrate 01, at least a portion of the pixel defining portion 401 does not overlap with the defining structure 200. For example, in the direction perpendicular to the base substrate 01, the defining structure 200 includes a portion overlapping with the pixel defining portion 401, a portion overlapping with the first opening 410, and a portion overlapping with the second opening 420. For example, at least a portion of the pixel defining portion 401 overlaps with a gap between adjacent defining structures 200 (as shown in FIG. 2, a white gap between adjacent defining structures is covered by the pixel defining portion).

For example, as shown in FIG. 3, along the direction perpendicular to the base substrate 01, a thickness of the defining structure 200 is less than a thickness of the pixel defining portion 401.

As shown in FIG. 2 and FIG. 3, the plurality of sub-pixels 10 includes a first sub-pixel 11 and a second sub-pixel 12, a turn-on voltage of the first sub-pixel 11 is higher than a turn-on voltage of the second sub-pixel 12; the defining structure 200 includes a first defining structure 210 and a second defining structure 220, the first defining structure 210 includes a portion surrounding the light-emitting region the first sub-pixel 11, and the second defining structure 220 includes a portion surrounding the light-emitting region of the second sub-pixel 12.

The first defining structure here includes a portion overlapping with the light-emitting region of the first sub-pixel and a portion surrounding the light-emitting region of the first sub-pixel; the second defining structure includes a portion overlapping with the light-emitting region of the second sub-pixel and a portion surrounding the light-emitting region of the second sub-pixel. For example, the second opening exposing the edge of the defining structure that surrounds the light-emitting region of the sub-pixel may be referred to as the second opening surrounding the light-emitting region of the sub-pixel; the second opening has a distance closer to the edge of the light-emitting region of the sub-pixel, and a distance further away from an edge of a light-emitting region of other sub-pixel.

As shown in FIG. 2 to FIG. 3, the first defining structure 210 is not exposed by the second opening 420, and the second defining structure 220 is exposed by the second opening 420. For example, neither the light-emitting functional layer 130 nor the second electrode 120 of the first sub-pixel 11 is disconnected at the edge of the first defining structure 210, while the light-emitting functional layer 130 and the second electrode 120 of the second sub-pixel 12 are both disconnected at the edge of the second defining structure 220. For example, the charge generation layer 133 in the light-emitting functional layer 130 that is shared by the first sub-pixel 11 and the second sub-pixel 12 may be disconnected at the edge of the second defining structure 220 that is exposed by the second opening 420, to reduce crosstalk between the first sub-pixel 11 and the second sub-pixel 12. For example, the above-described feature that the first defining structure is not exposed by the second opening refers to that the first defining structure is completely covered by the pixel defining portion surrounding the first opening and the second opening.

In the display substrate provided by the present disclosure, the first sub-pixel has a high turn-on voltage and high power consumption; a voltage at which the display substrate implements white light (e.g., a VSS voltage) is limited by a voltage difference between the first electrode and the second electrode of the first sub-pixel; for example, the first sub-pixel requires a higher cross voltage between the first electrode and the second electrode. By setting the first defining structure in the periphery of the first sub-pixel to not be exposed by the second opening, the second electrode of the first sub-pixel is not disconnected at an edge of the first defining structure corresponding thereto and thus has a conductive channel with a larger area, which improves a conductive effect of the second electrode of the first sub-pixel, and is favorable for avoiding excessive power consumption and brightness uniformity problems of the display substrate.

The display substrate shown in FIG. 2 adopts a setting mode in which the first defining structure is not exposed by the second opening and the second defining structure is exposed by the second opening, which is favorable for better balancing crosstalk and power consumption of the display substrate.

FIG. 2 schematically shows that the first sub-pixel 11 and the second sub-pixel 12 are sub-pixels configured to emit light with different colors, but it is not limited thereto, and the first sub-pixel and the second sub-pixel may also be configured as sub-pixels emitting light of a same color.

In some examples, as shown in FIG. 2, the plurality of sub-pixels 10 further includes a third sub-pixel 13.

For example, as shown in FIG. 2, an area of a light-emitting region of one first sub-pixel 11 is larger than an area of a light-emitting region of one second sub-pixel 12, and the area of the light-emitting region of one first sub-pixel 11 is larger than an area of a light-emitting region of one third sub-pixel 13. For example, the area of the light-emitting region of one second sub-pixel 12 is larger than the area of the light-emitting region of one third sub-pixel 13. For example, luminous efficiency of the first sub-pixel 11 is lower than luminous efficiency of the second sub-pixel 12 and luminous efficiency of the third sub-pixel 13.

Luminous efficiency of a sub-pixel refers to an intensity of light emitted by a light-emitting device under a same electrical signal condition. Assuming that the light intensity is high, then the luminous efficiency is considered to be great. For example, the same electrical signal condition refers to voltages being written to a data line being the same. For example, under the same electrical signal condition, currents written into the light-emitting device are the same. For example, luminous efficiency of a sub-pixel refers to a current density flowing through the light-emitting device under the same electrical signal condition.

In some examples, as shown in FIG. 2, the first sub-pixel 11 is a blue sub-pixel, one of the second sub-pixel 12 and the third sub-pixel 13 is a red sub-pixel, and the other of the second sub-pixel 12 and the third sub-pixel 13 is a green sub-pixel. FIG. 2 schematically shows that the second sub-pixel is a red sub-pixel, and the third sub-pixel is a green sub-pixel, but it is not limited thereto; the second sub-pixel may also be a green sub-pixel, and the third sub-pixel is a red sub-pixel.

In some examples, as shown in FIG. 2 and FIG. 3, a turn-on voltage of the first sub-pixel 11 is 0.1 V to 5 V higher than a turn-on voltage of the second sub-pixel 12. For example, the turn-on voltage of the first sub-pixel 11 is 0.1 V to 5 V higher than a turn-on voltage of the third sub-pixel 13. For example, the turn-on voltage may refer to a voltage applied by a device when light emission brightness is 1 $cd/m^2$, or may also be referred to as a light emission threshold voltage.

For example, the turn-on voltage of the first sub-pixel 11 is 0.5 V to 4.5 V higher than the turn-on voltage of the second sub-pixel 12. For example, the turn-on voltage of the first sub-pixel 11 is 1 V to 4 V higher than the turn-on voltage of the second sub-pixel 12. For example, the turn-on voltage of the first sub-pixel 11 is 1.5 V to 3.5 V higher than the turn-on voltage of the second sub-pixel 12. For example, the turn-on voltage of the first sub-pixel 11 is 2 V to 3 V higher than the turn-on voltage of the second sub-pixel 12. For example, the turn-on voltage of the first sub-pixel 11 is 0.5 V to 4.5 V higher than the turn-on voltage of the third sub-pixel 13. For example, the turn-on voltage of the first sub-pixel 11 is 1 V to 4 V higher than the turn-on voltage of the third sub-pixel 13. For example, the turn-on voltage of the first sub-pixel 11 is 1.5 V to 3.5 V higher than the turn-on voltage of the third sub-pixel 13. For example, the turn-on voltage of the first sub-pixel 11 is 2 V to 3 V higher than the turn-on voltage of the third sub-pixel 13. For example, the turn-on voltage of the first sub-pixel 11 is 1.5 V higher than the turn-on voltage of the second sub-pixel 12. For example, the turn-on voltage of the first sub-pixel 11 is 1.5 V higher than the turn-on voltage of the third sub-pixel 13.

For example, power consumption of the first sub-pixel 11 is greater than power consumption of the second sub-pixel 12 and the third sub-pixel 13.

In some examples, as shown in FIG. 2, a portion of the second defining structure 220 that is exposed by the second opening 420, for example, the isolation portion 201, is a non-closed ring structure, and a proportion of the non-closed ring structure to the perimeter of the second defining structure 220 is 10% to 80%. The perimeter of the second defining structure here refers to a perimeter of an edge of the second defining structure surrounding the light-emitting region of the second sub-pixel by one loop.

For example, a proportion of the non-closed ring structure to a perimeter of a first opening corresponding to the second sub-pixel is 10% to 80%, for example, 15% to 50%, for example, 20% to 75%, for example, 25% to 60%, for example, 30% to 70%, for example, 45% to 55%, for example, 50% to 65%.

For example, a proportion of the isolation portion 201 to the perimeter of the second defining structure 220 is 15% to 50%. For example, the proportion of the isolation portion 201 to the perimeter of the second defining structure 220 is 20% to 75%. For example, the proportion of the isolation portion 201 to the perimeter of the second defining structure 220 is 25% to 60%. For example, the proportion of the isolation portion 201 to the perimeter of the second defining structure 220 is 30% to 70%. For example, the proportion of the isolation portion 201 to the perimeter of the second defining structure 220 is 45% to 55%. For example, the proportion of the isolation portion 201 to the perimeter of the second defining structure 220 is 50% to 65%.

For example, a proportion of an area of a non-closed ring isolation portion 201 to an area of a closed ring edge where the isolation portion 201 is located in the second defining structure 220 is 10% to 80%, or 15% to 50%, or 25% to 60%, or 30% to 70%.

For example, as shown in FIG. 2, a portion in the second defining structure 220 that is located between the light-emitting regions of the first sub-pixel 11 and the second sub-pixel 12 is exposed by the second opening 420 to disconnect at least one film layer shared by the first sub-pixel 11 and the second sub-pixel 12; and a portion in the second defining structure 220 that is located between the light-emitting regions of the first sub-pixel 11 and the second sub-pixel 12 and is not exposed by the second opening 420 forms a channel for conducting the second electrode 120 of the first sub-pixel 11 and the second sub-pixel 12, which is favorable for improving a conductive effect of the second electrode shared by the first sub-pixel and the second sub-pixel.

For example, as shown in FIG. 2, the portion in the second defining structure 220 that is located between the light-emitting regions of the first sub-pixel 11 and the second sub-pixel 12 includes a part exposed by the second opening 420 and a part not exposed by the second opening 420; an area of the above-described part exposed by the second opening 420 is larger than an area of the part not exposed by the second opening 420, so as to ensure the conductive effect of the second electrodes of the first sub-pixel and the second sub-pixel, and at the same time, minimize the crosstalk caused by the electrical connection of the common layer in the light-emitting functional layers of the first sub-pixel and the second sub-pixel.

For example, as shown in FIG. 2, a portion in the second defining structure 220 that is located between the light-emitting regions of the second sub-pixel 12 and the third sub-pixel 13 is exposed by the second opening 420 to disconnect the common layer between the second sub-pixel 12 and the third sub-pixel 13, so as to reduce crosstalk caused by electrical connection between the common layer in the light-emitting functional layers of the two.

For example, as shown in FIG. 2, a distance between an edge of the isolation portion 201 in the second defining structure 220 that is exposed by the second opening 420 and is used for disconnecting the light-emitting functional layer 130, and an edge of a first opening 410 corresponding to the second sub-pixel 12 is less than a distance between the edge of the isolation portion 201 and an edge of the light-emitting region of the third sub-pixel 13, and the distance between the edge of the isolation portion 201 in the second defining structure 220 that is exposed by the second opening 420 and is used for disconnecting the light-emitting functional layer 130, and an edge of a first opening 410 corresponding to the second sub-pixel 12 is less than a distance between the edge of the isolation portion 201 and the edge of the light-emitting region of the first sub-pixel 11.

In some examples, as shown in FIG. 2 and FIG. 3, the defining structure 200 further includes a third defining structure 230, the third defining structure 230 includes a portion surrounding the light-emitting region the third sub-pixel 13; the third defining structure 230 is not exposed by the second opening 420, or the third defining structure 230 is exposed by the second opening 420.

The third defining structure here may include a portion overlapping with the light-emitting region of the third sub-pixel and a portion surrounding the light-emitting region of the third sub-pixel.

In some examples, as shown in FIG. 2, a portion of the third defining structure 230 that is exposed by the second opening 420, for example, the isolation portion 201, is a non-closed ring structure; and a proportion of the non-closed ring structure to a perimeter of the third defining structure 230 is 10% to 80%. The perimeter of the third defining structure here refers to a perimeter of an edge of the third defining structure surrounding the light-emitting region of the third sub-pixel by one loop.

For example, a proportion of the non-closed ring structure to a perimeter of a first opening corresponding to the third sub-pixel is 10% to 80%, for example, 15% to 50%, for example, 20% to 75%, for example, 25% to 60%, for example, 30% to 70%, for example, 45% to 55%, for example, 50% to 65%.

For example, a proportion of the isolation portion 201 to the perimeter of the third defining structure 230 is 15% to 50%. For example, the proportion of the isolation portion 201 to the perimeter of the third defining structure 230 is 20% to 75%. For example, the proportion of the isolation portion 201 to the perimeter of the third defining structure 230 is 25% to 60%. For example, the proportion of the isolation portion 201 to the perimeter of the third defining structure 230 is 30% to 70%. For example, the proportion of the isolation portion 201 to the perimeter of the third defining structure 230 is 45% to 55%. For example, the proportion of the isolation portion 201 to the perimeter of the third defining structure 230 is 50% to 65%.

For example, a proportion of an area of the non-closed ring isolation portion 201 to an area of the closed ring edge where the isolation portion is located in the third defining structure 230 is 10% to 80%, or 15% to 50%, or 25% to 60%, or 30% to 70%, and so on.

For example, as shown in FIG. 2, a portion in the third defining structure 230 that is located between the light-emitting regions of the first sub-pixel 11 and the third sub-pixel 13 is exposed by the second opening 420 to disconnect at least one film layer shared by the first sub-pixel 11 and the third sub-pixel 13, and a portion in the third defining structure 230 that is located between the light-emitting regions of the first sub-pixel 11 and the third sub-pixel 13 and is not exposed by the second opening 420 forms a channel for conducting the second electrode 120 of the first sub-pixel 11 and the third sub-pixel 13, which is favorable for improving a conductive effect of the second electrode shared by the first sub-pixel and the third sub-pixel.

For example, as shown in FIG. 2, a portion in the third defining structure 230 that is located between the light-emitting regions of the second sub-pixel 12 and the third sub-pixel 13 is not exposed by the second opening 420; and the film layer shared by the second sub-pixel 12 and the third sub-pixel 13 is only isolated by the isolation portion 201 in the second defining structure 220 that is exposed by the second opening 420.

For example, as shown in FIG. 2 and FIG. 3, the second electrode located at the positions of the portion of the second defining structure 220 that is not exposed by the second opening 420, the portion of the third defining structure 230 that is not exposed by the second opening 420, and the first defining structure 210 is in a communication state to form the conductive electrode, which is favorable for improving a conductive effect of the second electrode.

For example, as shown in FIG. 2, a distance between an edge of the isolation portion 201 of the third defining structure 230 that is exposed by the second opening 420 and an edge of a first opening 410 corresponding to the third sub-pixel 13 is less than a distance between the edge of the isolation portion 201 and the edge of the light-emitting region of the second sub-pixel 12, and the distance between the edge of the isolation portion 201 of the third defining structure 230 that is exposed by the second opening 420 and the edge of the first opening 410 corresponding to the third sub-pixel 13 is less than a distance between the edge of the isolation portion 201 and the edge of the light-emitting region of the first sub-pixel 11.

For example, as shown in FIG. 2, only the isolation portion 201 of the third defining structure 230 that is exposed by the second opening 420 is provided between the first sub-pixel 11 and the third sub-pixel 13 adjacent to each other, only the isolation portion 201 of the second defining structure 220 that is exposed by the second opening 420 is provided between the first sub-pixel 11 and the second sub-pixel 12 adjacent to each other, only the isolation portion 201 of the second defining structure 220 that is exposed by the second opening 420 or the isolation portion 201 of the third defining structure 230 that is exposed by the second opening 420 is provided between the second sub-pixel 12 and the third sub-pixel 13 adjacent to each other.

In some examples, as shown in FIG. 2, the plurality of sub-pixels 10 is arranged into a plurality of first sub-pixel groups 001 and a plurality of second sub-pixel groups 002 arranged alternately along the first direction; the respective first sub-pixel groups 001 each include first sub-pixels 11 and second sub-pixels 12 arranged alternately along the second direction, the respective second sub-pixel groups 002 each include third sub-pixels 13 arranged along the second direction, and the first direction intersects with the second direction.

For example, the first direction may be an X direction shown in FIG. 2, the second direction may be a Y direction shown in FIG. 2, and the first direction and the second direction may be interchanged. For example, an included angle between the first direction and the second direction may be 80 degrees to 120 degrees. For example, the first direction is perpendicular to the second direction. For example, one of the first direction and the second direction may be a row direction, and the other may be a column direction. For example, the first direction may be a row direction and the second direction may be a column direction, the first sub-pixel group may be a first sub-pixel column, and the second sub-pixel group may be a second sub-pixel column; and the first direction may be a column direction, and the second direction may be a row direction, the first sub-pixel group may be a first sub-pixel row, and the second sub-pixel group may be a second sub-pixel row.

In some examples, as shown in FIG. 2, the first sub-pixel group 001 and the second sub-pixel group 002 are shifted from each other in the second direction, and respective first sub-pixels 11 among at least some first sub-pixels 11 are surrounded by eight sub-pixels 10, and the eight sub-pixels 10 include third sub-pixels 13 and second sub-pixels 12 arranged alternately.

For example, as shown in FIG. 2, the first sub-pixels 11 and the second sub-pixels 12 are arranged alternately along the second direction, and the third sub-pixels 13 are arranged in an array along the first direction and the second direction. For example, respective second sub-pixels 12 among at least some second sub-pixels 12 are surrounded by eight sub-pixels 10, and the eight sub-pixels 10 include third sub-pixels 13 and first sub-pixels 11 arranged alternately.

In some examples, as shown in FIG. 2, the second defining structure 220 includes a non-closed ring second isolation portion 2012 surrounding the second sub-pixel 12; shapes of the light-emitting regions of the first sub-pixel 11, the second sub-pixel 12, and the third sub-pixel 13 are all quadrilaterals, and the second isolation portion 2012 only surrounds four edges of the light-emitting region of the second sub-pixel 12. For example, the second isolation portion 2012 exposes four corner portions formed by connecting four edges of the light-emitting region of the second sub-pixel 12. For example, a length of the second isolation portion 2012 corresponding to the edge of the light-emitting region of the second sub-pixel 12 may be greater than an edge length of the light-emitting region or less than the edge length of the light-emitting region.

In some examples, as shown in FIG. 2, the third defining structure 230 includes a non-closed ring third isolation portion 2013 surrounding the light-emitting region of the third sub-pixel 13, and the third isolation portion 2013 surrounds two edges of the light-emitting region of the third sub-pixel 13 that are closely adjacent to the light-emitting region of the first sub-pixel 11. For example, two edges of the light-emitting region of the third sub-pixel 13 that are closely adjacent to the light-emitting region of the second sub-pixel 12 are exposed by the third isolation portion 2013. For example, a length of the third isolation portion 2013 corresponding to the edge of the light-emitting region of the third sub-pixel 13 may be greater than an edge length of the light-emitting region or less than the edge length of the light-emitting region.

For example, as shown in FIG. 2, the third isolation portion 2013 exposes at least one corner portion of four corner portions formed by connecting four edges of the light-emitting region of the third sub-pixel 13.

The above-described second isolation portion is a portion of the second defining structure that is exposed by the second opening; for example, the second defining structure surrounding the light-emitting region of the second sub-pixel includes a closed ring edge, and a portion in the closed ring edge that is exposed by the second opening is the second isolation portion. The above-described third isolation portion is a portion of the third defining structure that is exposed by the second opening, for example, the third defining structure surrounding the light-emitting region of the third sub-pixel includes a closed ring edge, and a portion of the closed ring edge that is exposed by the second opening is the third isolation portion. Shapes of the second isolation portion and the third isolation portion as described above are determined by the shape of the second opening.

In some examples, as shown in FIG. 2, a ring width of a ring portion in the first defining structure 210 that is not covered by the first electrode 110 of the first sub-pixel 11 is less than a ring width of a ring portion in the second defining structure 220 that is not covered by the first electrode 110 of the second sub-pixel 12. This may prevent the second opening from exposing the first electrode of the second sub-pixel, when providing the second opening for exposing the edge of the second defining structure.

For example, as shown in FIG. 2, the ring width RW1 of the ring portion in the first defining structure 210 that is not covered by the first electrode 110 of the first sub-pixel 11 is less than the ring width RW2 in at least a some positions in the ring portion in the second defining structure 220 that is not covered by the first electrode 110 of the second sub-pixel 12; and the at least a some positions include a portion overlapping with the second opening 420. The ring width RW1 of the ring portion in the first defining structure 210 that is not covered by the first electrode 110 of the first sub-pixel 11 is less than a ring width RW3 in at least some positions in the ring portion in the third defining structure 220 that is not covered by the first electrode 110 of the third sub-pixel 13, and the at least some positions include a portion overlapping with the second opening 420. This may prevent the second opening from exposing an edge of the first defining structure that is closely adjacent thereto, while preventing the second opening from exposing the first electrodes of the second sub-pixel and the third sub-pixel, when providing the second opening for exposing the edges of the second defining structure and the third defining structure. The above-described "ring width" refers to a minimum distance between the edge of the first electrode and the edge of the defining structure surrounding the first electrode in FIG. 2, for example, edges of the two are substantially parallel to each other.

For example, as shown in FIG. 2, the first defining structure 210 is not exposed by the second opening; for example, the edge of the first defining structure 210 is located on an outer side of the edge of the first electrode, for example, protrudes outward; and a distance between the edge of the first defining structure 210 and the edge of the first electrode corresponding thereto may be set very small; or the edge of the first defining structure 210 may be flush with the edge of the first electrode; or the edge of the first defining structure 210 may shrink inwards relative to the edge of the first electrode, but the edge of the first defining structure 210 need be located on an outer side the edge of the light-emitting region of the first sub-pixel.

For example, as shown in FIG. 2, more than 60% of the ring portion in the first defining structure 210 that is not covered by first electrode 110 of the first sub-pixel 11 has a substantially equal ring width.

For example, as shown in FIG. 2, a ring portion in the third defining structure 230 that is not covered by the first electrode 110 of the third sub-pixel 13 includes a first portion exposed by the second opening 420 and a second portion not exposed by the second opening 420; a ring width of the first portion is greater than a ring width of the second portion, to prevent the third defining structure from being exposed by the second opening used for exposing a defining structure corresponding to other sub-pixel, while the second opening exposes a portion of the edge of the third defining structure, so as to improve continuity of the second electrode of the third sub-pixel.

For example, as shown in FIG. 2, the second defining structure 220 is exposed by the second opening 420 corresponding to each edge of the light emitting region of the second sub-pixel 12, and more than 60% of the ring portion in the second defining structure 220 that is not covered by first electrode 110 of the second sub-pixel 12 has a substantially equal ring width.

For example, as shown in FIG. 2, a portion of the second defining structure 220 corresponding to at least one second sub-pixel 12 that is exposed by the second opening 420 is a structure spaced apart. For example, a portion of the third defining structure 230 corresponding to at least one third sub-pixel 13 that is exposed by the second opening 420 is a structure spaced apart. The above-described defining structure corresponding to a sub-pixel refers to a defining structure overlapping with a light-emitting region of the sub-pixel.

For example, FIG. 2 schematically shows a case where the defining structure corresponding to the sub-pixel with one color is not exposed by the second opening, while defining structures corresponding to sub-pixels with other colors are all exposed by the second openings. For example, the defining structure corresponding to the blue sub-pixel is not exposed by the second opening, and defining structures corresponding to the red sub-pixel and the green sub-pixel are both exposed by the second openings. But it is not limited thereto, it may also be the case where the defining structure corresponding to the green sub-pixel is not exposed by the second opening, or the defining structure corresponding to the red sub-pixel is not exposed by the second opening.

For example, as shown in FIG. 2, a ratio of a width of the second opening 420 configured to expose the second defining structure 220 to a width of the second opening 420 configured to expose the third defining structure 230 is 0.5 to 1.5. For example, the ratio of the width of the second opening 420 configured to expose the second defining structure 220 to the width of the second opening 420 configured to expose the third defining structure 230 is 0.6 to 1.2, or 0.7 to 1.4, or 0.8 to 1.1, or 0.9 to 1.3. For example, the width of the second opening 420 configured to expose the second defining structure 220 is equal to the width of the second opening 420 configured to expose the third defining structure 230.

For example, as shown in FIG. 3, along the direction perpendicular to the base substrate 01, a maximum thickness of a portion in the pixel defining portion 401 that overlaps with the defining structure 200 is less than a maximum thickness of a portion in the pixel defining portion 401 that does not overlap with the defining structure 200. For example, the maximum thickness of the portion in the pixel defining portion 401 that overlaps with the defining structure 200 may be 0.4 microns, and the maximum thickness of the portion in the pixel defining portion 401 that does not overlap with the defining structure 200 may be 0.6 microns.

Figure 4:
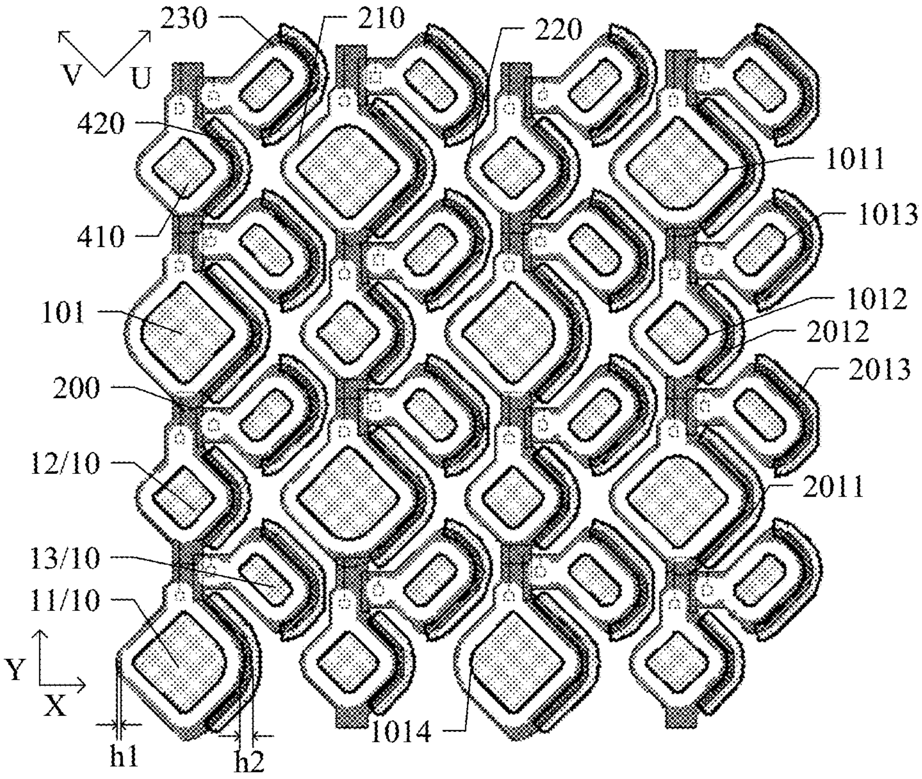
FIG. 4 to FIG. 7 are structural diagrams of the A11 region of the display substrate shown in FIG. 1 in different examples.

FIG. 4 is a structural diagram of the A11 region of the display substrate shown in FIG. 1 in another example. The display substrate shown in FIG. 4 differs from the display substrate shown in FIG. 2 in a different positional relationship between the second opening 420 and the defining structure 200. Features such as the structures included by the respective sub-pixels, the arrangement mode of the plurality of sub-pixels, the first opening in the pixel defining pattern, and the positional relationship between the first opening and the defining structure in the display substrate shown in FIG. 4 may have the same relationship as the above-described features in the display substrate shown in FIG. 2, and no details will be repeated here.

As shown in FIG. 4, a proportion of an edge length in the first defining structure 210 that is exposed by the second opening 420 to the perimeter of the first opening 410 corresponding to the first sub-pixel is less than a proportion of an edge length in the second defining structure 220 that is exposed by the second opening 420 to the perimeter of the first opening 410 corresponding to the second sub-pixel.

The proportion of the portion of the defining structure that is exposed by the second opening to the defining structure as described above and later may refer to a proportion of a length of the portion of the defining structure that is exposed by the second opening to the perimeter of the edge of the defining structure surrounding the light-emitting region of the sub-pixel by one loop, or may also refer to a proportion of an area of the portion of the defining structure that is exposed by the second opening to the area of the edge of the defining structure surrounding the light-emitting region of the sub-pixel by one loop.

In the case where the turn-on voltage of the first sub-pixel is higher than the turn-on voltage of the second sub-pixel, and the first defining structure and the second defining structure are both exposed by the second openings, the proportion of the portion of the first defining structure that is exposed by the second opening is set to be less than the proportion of the second defining structure that is exposed by the second opening, so that the second electrode of the first sub-pixel has the conductive channel of a larger area, which improves a conductive effect of the second electrode of the first sub-pixel, and is favorable for avoiding excessive power consumption and brightness uniformity problems of the display substrate.

In some examples, as shown in FIG. 4, a proportion of the edge length of the portion in the first defining structure 210 that is exposed by the second opening 420 to a perimeter of a ring portion in the first defining structure 210 that surrounds the first opening is less than a proportion of the edge length of the portion in the third defining structure 230 that is exposed by the second opening 420 to a perimeter of a ring portion in the third defining structure 230 that surrounds the first opening.

In the case where the turn-on voltage of the first sub-pixel is higher than the turn-on voltage of the second pixel and the turn-on voltage of the third sub-pixel, and the first defining structure, the second defining structure, and the third defining structure are all exposed by the second openings, the proportion of the first defining structure that is exposed by the second opening is set to be less than the proportion of the second defining structure that is exposed by the second opening and the proportion of the third defining structure that is exposed by the second opening, so that the second electrode of the first sub-pixel have the conductive channel of a larger area, which improves a conductive effect of the second electrode of the first sub-pixel, and is favorable for avoiding excessive power consumption and brightness uniformity problems of the display substrate.

In some examples, as shown in FIG. 4, the first defining structure 210 includes a non-closed ring first isolation portion 2011 surrounding the light-emitting region of the first sub-pixel 11, the second defining structure 220 includes a non-closed ring second isolation portion 2012 surrounding the light-emitting region of the second sub-pixel 12, and the third defining structure 230 includes a non-closed ring third isolation portion 2013 surrounding the light-emitting region of the third sub-pixel 13.

The above-described first isolation portion is a portion of the first defining structure that is exposed by the second opening; for example, the first defining structure surrounding the light-emitting region of the first sub-pixel includes a closed ring edge, and a portion in the closed ring edge that is exposed by the second opening is the first isolation portion. The above-described second isolation portion is a portion of the second defining structure that is exposed by the second opening, for example, the second defining structure surrounding the light-emitting region of the second sub-pixel includes a closed ring edge, and a portion of the closed ring edge that is exposed by the second opening is the second isolation portion. The above-described third isolation portion is a portion of the third defining structure that is exposed by the second opening, for example, the third defining structure surrounding the light-emitting region of the third sub-pixel includes a closed ring edge, and a portion of the closed ring edge that is exposed by the second opening is the third isolation portion. Shapes of the first isolation portion, the second isolation portion, and the third isolation portion as described above are determined by the shape of the second opening.

For example, as shown in FIG. 4, a ratio of an area of the first isolation portion 2011 to the area of the first defining structure 210 is 10% to 80%, for example, 15% to 50%, for example, 20% to 40%, for example, 30% to 70%, for example, 25% to 45%, etc. For example, a ratio of an area of the second isolation portion 2012 to the area of the second defining structure 220 is 10% to 80%, for example, 15% to 50%, for example, 20% to 40%, for example, 30% to 70%, for example, 25% to 45%, etc. For example, a ratio of an area of the third isolation portion 2013 to the area of the third defining structure 230 is 10% to 80%, for example, 15% to 50%, for example, 20% to 40%, for example, 30% to 70%, for example, 25% to 45%, etc. For example, the ratio of the area of the first isolation portion 2011 to the area of the first defining structure 210 is less than the ratio of the area of the second isolation portion 2012 to the area of the second defining structure 220, and the ratio of the area of the first isolation portion 2011 to the area of the first defining structure 210 is less than the ratio of the area of the third isolation portion 2013 to the area of the third defining structure 230. The above-described ratio of each area of each isolation portion to the area of each defining structure refers to a ratio of the area of the isolation portion to the area of one loop of the closed ring edge of the defining structure that includes the isolation portion.

In some examples, as shown in FIG. 4, shapes of the light-emitting regions 101 of the first sub-pixel 11, the second sub-pixel 12, and the third sub-pixel 13 are all quadrilaterals; the first isolation portion 2011 surrounds two adjacent edges of the light-emitting region of the first sub-pixel 11 and a first corner portion 1011 formed by connecting the two edges, the second isolation portion 2012 surrounds two adjacent edges of the light-emitting region of the second sub-pixel 12 and a second corner portion 1012 formed by connecting the two edges, the third isolation portion 2013 surrounds two adjacent edges of the light-emitting region of the third sub-pixel 13 and a third corner portion 1013 formed by connecting the two edges; and orientations of the first corner portion 1011, the second corner portion 1012, and the third corner portion 1013 are all the same. FIG. 4 schematically shows that the first corner portion, the second corner portion, and the third corner portion all face leftwards, for example, a direction opposite to a direction indicated by an arrow in the X direction. But it is not limited thereto, the first corner portion, the second corner portion, and the third corner portion may all face rightwards, or face upwards, as indicated by an arrow in the Y direction, or face downwards.

The respective isolation portions are arranged in corner portion positions with a same orientation in the respective sub-pixels, which is favorable for isolating at least one layer of the light-emitting functional layer in an orientation of the respective corner portions, and preventing crosstalk between adjacent sub-pixels; and meanwhile, other corner portions are provided with no isolation portions, which is favorable for implementing electrical connection of the second electrode of the respective sub-pixels in a position other than the isolation portion, and is favorable for reducing power consumption.

For example, as shown in FIG. 3 and FIG. 4, the first electrode 110 of each sub-pixel 10 is located on a side of the defining structure 200 away from the base substrate 01; each sub-pixel 10 further includes a pixel circuit (not shown), for example, includes a plurality of transistors and at least one capacitor, the pixel circuit is located on a side of the defining structure 200 away from the first electrode 110, and the first electrode 110 is electrically connected with the pixel circuit through a connection via hole running through the defining structure 200, so the position of the second opening corresponding to each sub-pixel should be set taking into account a position of the connection via hole in the above-described defining structure, so as to avoid the above-described connection via hole. For example, the connection via holes of the first sub-pixel 11 and the second sub-pixel 12 are located on an upper side of the light-emitting regions thereof, and the connection via hole of the third sub-pixel 13 is located on a left side of the light-emitting region thereof, then the first corner portion, the second corner portion, and the third corner portion as described above may all face leftwards or upwards to avoid the position of the connection via holes.

For example, as shown in FIG. 4, the defining structure 200 includes a connection portion located between connection via holes of the first sub-pixel 11 and the third sub-pixel 13 that are closer to each other, and the connection portion connects the first defining structure 210 and the third defining structure 230. For example, the connection portion is an integrated structure with the first defining structure 210 and the third defining structure 230 connected therewith. Similarly, the defining structure 200 further includes a connection portion located between connection via holes of the second sub-pixel 12 and the third sub-pixel 13 that are closer to each other, and the connection portion connects the second defining structure 220 and the third defining structure 230, for example, the connection portion is an integrated structure with the second defining structure 220 and the third defining structure 230 connected therewith.

For example, as shown in FIG. 4, the first isolation portion 2011 or the second isolation portion 2012 is provided between the first sub-pixel 11 and the second sub-pixel 12 arranged along the X direction. For example, no second opening 420 may be provided between the first sub-pixel 11 and the second sub-pixel 12 arranged along the Y direction to avoid affecting an anode connection via hole. For example, the first isolation portion 2011 or the third isolation portion 2013 is provided between the first sub-pixel 11 and the third sub-pixel 13, and the second isolation portion 2012 or the third isolation portion 2013 is provided between the second sub-pixel 12 and the third sub-pixel 13.

For example, as shown in FIG. 4, one first sub-pixel 11 is surrounded by four third sub-pixels 13, a portion of the first sub-pixel 11 that faces two third sub-pixels 13 is not provided with the first isolation portion 2011, and the two third sub-pixels 13 are each provided with the third isolation portion 2013 on a side thereof facing the first sub-pixel 11, so that a portion in the second electrode of the first sub-pixel 11 that is close to the two third sub-pixels 13 is continuously arranged; similarly, one second sub-pixel 12 is surrounded by four third sub-pixels 13, and a portion in the second electrode of the second sub-pixel 12 that is close to the two third sub-pixels 13 is continuously arranged.

For example, as shown in FIG. 4, only one isolation portion is provided between two adjacent sub-pixels arranged along the X direction, only one isolation portion is provided between two adjacent sub-pixels arranged along the U direction, and only one isolation portion is provided between two adjacent sub-pixels arranged along the V direction, to facilitate balancing crosstalk and power consumption between adjacent sub-pixels.

In some examples, as shown in FIG. 4, a proportion of the portion in the first defining structure 210 that is exposed by the second opening 420 to the perimeter of the ring portion of the first defining structure 210 that surrounds the first opening is less than a proportion of the portion in the second defining structure 210 that is exposed by the second opening 420 to the perimeter of the ring portion of the second defining structure 220 that surrounds the first opening; a ring width of a portion having no overlapping portion with the second opening 420 in the ring portion of the first defining structure 210 that is not covered by the first electrode 110 of the first sub-pixel 11 is a first ring width h1, a ring width of a portion having an overlapping portion with the second opening 420 in the ring portion is a second ring width h2, and the first ring width h1 is less than the second ring width h2.

Setting of widths in different positions in the ring portion of the first defining structure that is not covered by the first electrode of the first sub-pixel may prevent the second opening from exposing the edge of the first electrode of the first sub-pixel and affecting display performance, while implementing isolating of partial light-emitting functional layer and continuous arrangement of partial second electrode.

For example, as shown in FIG. 4, a ring width of a portion having no overlapping portion with the second opening 420 in the ring portion of the second defining structure 220 that is not covered by the first electrode 110 of the second sub-pixel 12 is less than a ring width of a portion having an overlapping portion with the second opening 420 in the ring portion. For example, a ring width of a portion having no overlapping portion with the second opening 420 in the ring portion of the third defining structure 230 that is not covered by the first electrode 110 of the third sub-pixel 13 is less than a ring width of a portion having an overlapping portion with the second opening 420 in the ring portion. Thus, it is favorable for preventing the second opening configured to expose the first defining structure from exposing an edge of the third defining structure closely adjacent thereto, preventing the second opening configured to expose the third defining structure from exposing an edge of the first defining structure closely adjacent thereto, and preventing the second opening configured to expose the second defining structure from exposing an edge of the third defining structure closely adjacent thereto, and preventing the second opening configured to expose the third defining structure from exposing an edge of the second defining structure adjacent closely thereto.

For example, as shown in FIG. 4, a portion of the first defining structure 210 corresponding to at least one first sub-pixel 11 that is exposed by the second opening 420 is a continuous structure. For example, a portion of the second defining structure 220 corresponding to at least one second sub-pixel 12 that is exposed by the second opening 420 is a continuous structure. For example, a portion of the third defining structure 230 corresponding to at least one third sub-pixel 13 that is exposed by the second opening 420 is a continuous structure.

For example, FIG. 4 schematically shows that defining structures corresponding to sub-pixels with respective colors are all exposed by second openings, but the defining structures corresponding to sub-pixels with different colors that are exposed by second openings have different proportions, for example, a proportion of the defining structure corresponding to the sub-pixel of one color that is exposed by the second opening is less than proportions of defining structures corresponding to sub-pixels of the other two colors that are exposed by second openings. For example, the proportion of the defining structure corresponding to the blue sub-pixel that is exposed by the second opening is less than proportions of defining structures corresponding to the red sub-pixel and the green sub-pixel that are exposed by second openings.

For example, as shown in FIG. 4, a ratio of a width of the second opening 420 configured to expose the first defining structure 210 to a width of the second opening 420 configured to expose the second defining structure 220 is 0.5 to 1.5. For example, the ratio of the width of the second opening 420 configured to expose the first defining structure 210 to the width of the second opening 420 configured to expose the second defining structure 220 is 0.6 to 1.4, or 0.7 to 1.3, or 0.8 to 1.2, or 1.1 to 0.9. For example, the width of the second opening 420 configured to expose the first defining structure 210 is equal to the width of the second opening 420 configured to expose the second defining structure 220.

Figure 5:
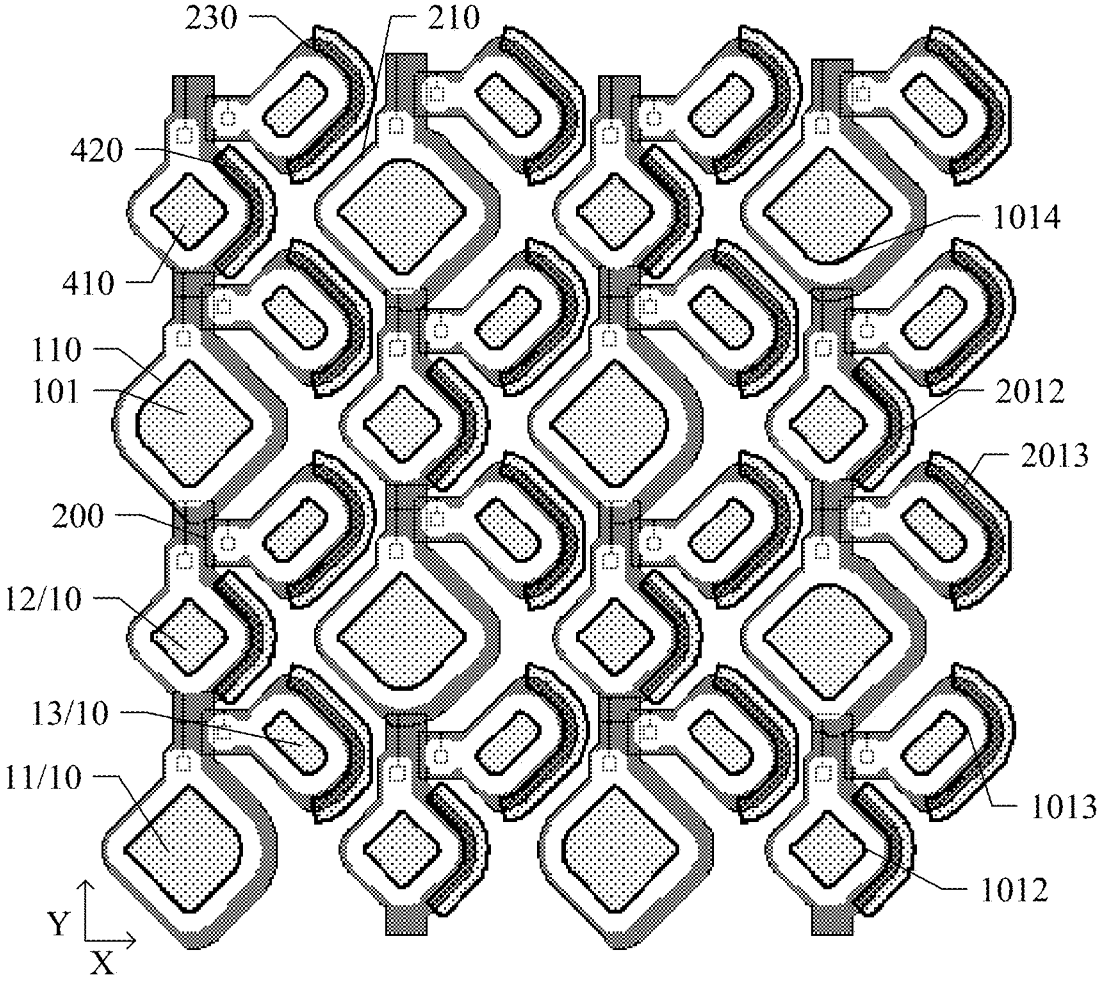

FIG. 5 is a structural diagram of the A11 region of the display substrate shown in FIG. 1 in another example. The display substrate shown in FIG. 5 differs from the display substrate shown in FIG. 4 in that the first defining structure 210 is not exposed by the second opening 420.

In some examples, as shown in FIG. 5, the first defining structure 210 is not exposed by the second opening 420, the second defining structure 220 includes a non-closed ring second isolation portion 2012 surrounding the light-emitting region of the second sub-pixel 12, and the third defining structure 230 includes a non-closed ring third isolation portion 2013 surrounding the light-emitting region of the third sub-pixel 13; shapes of the light-emitting regions of the first sub-pixel 11, the second sub-pixel 12, and the third sub-pixel 13 are all quadrilaterals, the second isolation portion 2012 surrounds two adjacent edges of the light-emitting region of the second sub-pixel 12 and a second corner portion 1012 formed by connecting the two edges, the third isolation portion 2013 surrounds two adjacent edges of the light-emitting region of the third sub-pixel 13 and a third corner portion 1013 formed by connecting the two edges; and the second corner portion 1012 and the third corner portion 1013 have the same orientation.

The second defining structure, the second isolation portion, the third defining structure, and third isolation portion shown in FIG. 5 may have the same features as the second defining structure, the second isolation portion, the third defining structure, and the third isolation portion shown in FIG. 4, and no details will be repeated here. The first opening, the structure of the sub-pixels, and the defining structure, etc. shown in FIG. 5 may have the same features as the first opening, the structure of the sub-pixels, and the defining structure, etc. shown in FIG. 4, and no details will be repeated here.

For example, as shown in FIG. 5, more than 60% of the ring portion of the first defining structure 210 that is not covered by the first electrode 110 of the first sub-pixel 11 has a substantially equal ring width.

Figure 6:
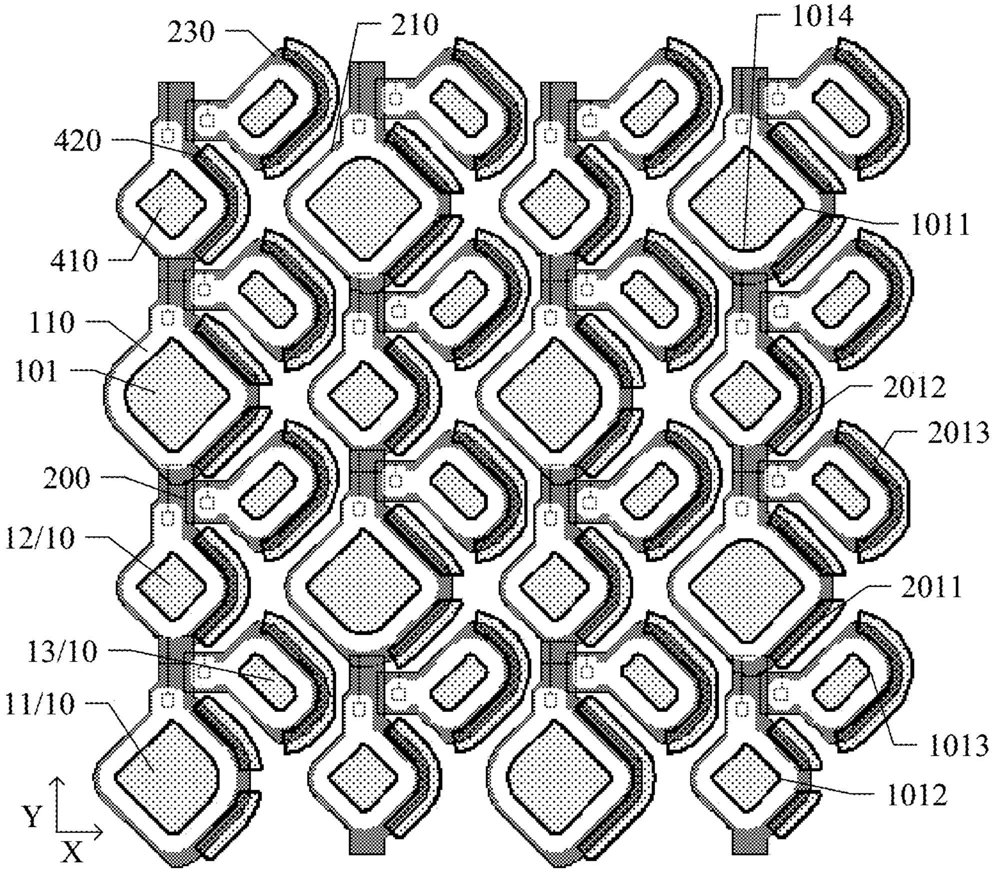

FIG. 6 is a structural diagram of the A11 region of the display substrate shown in FIG. 1 in another example. The display substrate shown in FIG. 6 differs from the display substrate shown in FIG. 4 in that the shape of the first defining structure 210 exposed by the second opening 420 is different.

In some examples, as shown in FIG. 6, at least one first isolation portion 2011 only surrounds a portion of the two adjacent edges of the light-emitting region of the first sub-pixel 11 except the first corner portion 1011 formed by connecting the two adjacent edges. By providing no second opening at the first defining structure in a position of the first corner portion of the first sub-pixel, it is favorable for improving continuity of the second electrode of the first sub-pixel while isolating at least one layer of the light-emitting functional layers of adjacent sub-pixels.

For example, as shown in FIG. 6, portions of the defining structure corresponding to at least one of the first sub-pixel 11, the second sub-pixel 12, and the third sub-pixel 13 that are exposed by the second opening 420 are structures spaced apart; and/or, a portion of the defining structure corresponding to at least one of the first sub-pixel 11, the second sub-pixel 12, and the third sub-pixel 13 that is exposed by the second opening 420 is a structure arranged continuously.

For example, as shown in FIG. 6, the portion of the first defining structure 210 corresponding to the first sub-pixel 11 that is exposed by the second opening 420 may be structures spaced apart, the portion of the second defining structure 220 corresponding to the second sub-pixel 12 that is exposed by the second opening 420 may be a structure arranged continuously, and the portion of the third defining structure 230 corresponding to the third sub-pixel 13 that is exposed by the second opening may be a structure arranged continuously.

For example, as shown in FIG. 6, at least one second isolation portion 2012 only surrounds a portion of the two adjacent edges of the light-emitting region of the second sub-pixel 12 except the second corner portion 1012 formed by connecting the two adjacent edges.

For example, as shown in FIG. 2 to FIG. 6, each edge of the light-emitting region of the first sub-pixel 11 or an extension line thereof is sequentially connected to form a polygon, and a plurality of vertices of the polygon have regions not overlapping with a plurality of corner portions of the corresponding light-emitting region. The light-emitting region of the first sub-pixel includes at least one specific corner portion 1014, and an area of a region where the specific corner portion 1014 does not overlap with the vertex of the polygon corresponding thereto is larger than an area of a region where the respective corner portions among at least some other corner portions do not overlap with the vertex of the polygon corresponding to the corner portion; and a portion in the defining structure 200 that corresponds to the specific corner portion 1014 is not exposed by the second opening 420. Because the specific corner portion of the first sub-pixel has a greater distance with the light-emitting region of the second sub-pixel than other corner portion, the light-emitting functional layer in a position of the specific corner portion has a lower degree of crosstalk with a light-emitting functional layer of an adjacent sub-pixel; and by setting the defining structure in the position corresponding to the specific corner portion to not be exposed by the second opening, it is favorable for improving continuity of the second electrode and reducing power consumption.

Figure 7:
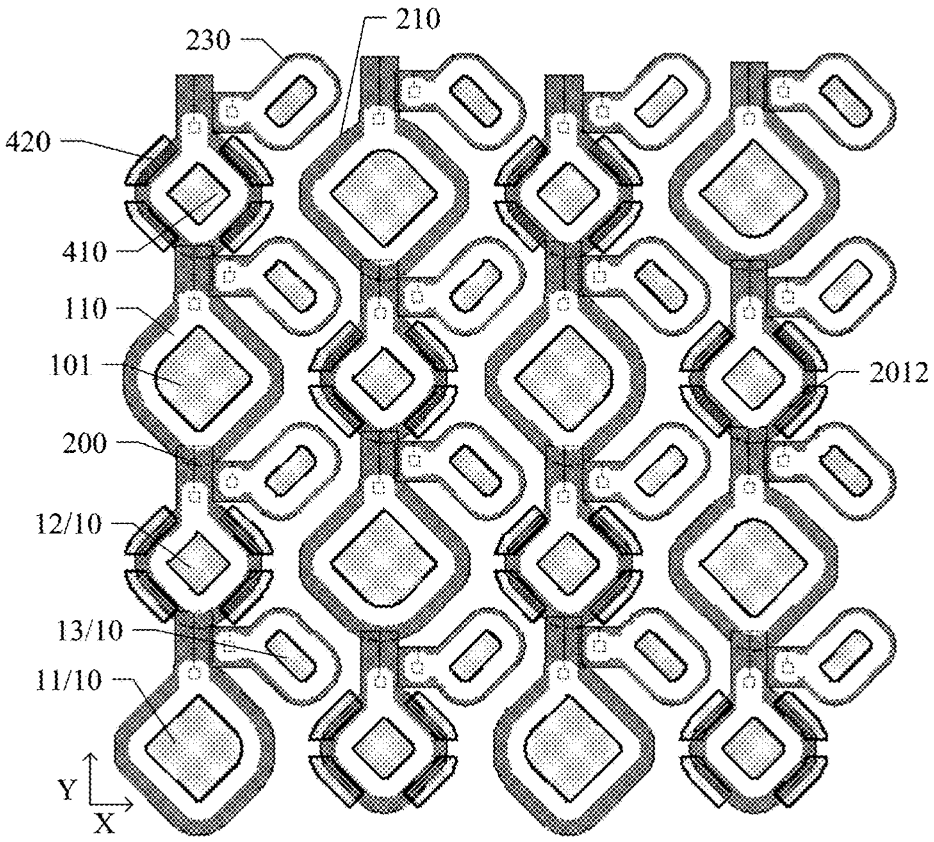

FIG. 7 is a structural diagram of the A11 region of the display substrate shown in FIG. 1 in another example. The display substrate shown in FIG. 7 differs from the display substrate shown in FIG. 2 in that the third defining structure 230 is not exposed by the second opening 420.

The shape and distribution of the second defining structure 220 exposed by the second opening 420 shown in FIG. 7 may be the same as the shape and distribution of the second defining structure 220 exposed by the second opening 420 shown in FIG. 2, and no details will be repeated here. As shown in FIG. 7, an edge of a defining structure only surrounding a light-emitting region of a sub-pixel with one color is exposed by the second opening, while edges of defining structures surrounding light-emitting regions of sub-pixels with other colors are not exposed by the second opening. For example, an edge of a defining structure only surrounding a light-emitting region of a red sub-pixel is exposed by a second opening, while edges of defining structures surrounding light-emitting regions of a blue sub-pixel and a green sub-pixel are not exposed by second openings. For example, portions in the position in the edge of the defining structure surrounding the light-emitting region of the sub-pixel with one color that correspond to the edge of the light-emitting region are all exposed by the second opening, and portions in the position in the edge that correspond to the corner portion of the light-emitting region are not exposed by the second opening.

In the example, only the defining structure corresponding to the sub-pixel with one color is set to be exposed by the second opening, which may minimizes crosstalk between the sub-pixel with the one color and sub-pixels with other colors, while greatly improving continuity of second electrodes of adjacent sub-pixels.

For example, as shown in FIG. 7, the ring width of the ring portion of the first defining structure 210 that is not covered by the first electrode 110 of the first sub-pixel 11 and the ring width of the ring portion of the second defining structure 220 that is not covered by the first electrode 110 of the second sub-pixel 12 are both greater than the ring width of the ring portion of the third defining structure 230 that is not covered by the first electrode 110 of the third sub-pixel 13, to prevent the second opening configured to expose the second defining structure from exposing the edge of the third defining structure.

For example, as shown in FIG. 7, a ratio of the ring width of the ring portion of the first defining structure 210 that is not covered by the first electrode 110 of the first sub-pixel 11 to the ring width of the ring portion of the second defining structure 220 that is not covered by the first electrode 110 of the second sub-pixel 12 is 0.8 to 1.2, or 0.9 to 1.1. For example, the ring width of the ring portion of the first defining structure 210 that is not covered by the first electrode 110 of the first sub-pixel 11 and the ring width of the ring portion of the second defining structure 220 that is not covered by the first electrode 110 of the second sub-pixel 12 are equal.

In the display substrate provided by the respective examples of the present disclosure, the same second opening only exposes the defining structure surrounding the light-emitting region of one sub-pixel, to improve continuity of second electrodes of adjacent sub-pixels to reduce power consumption, while reducing crosstalk between adjacent sub-pixels.

Figure 8:
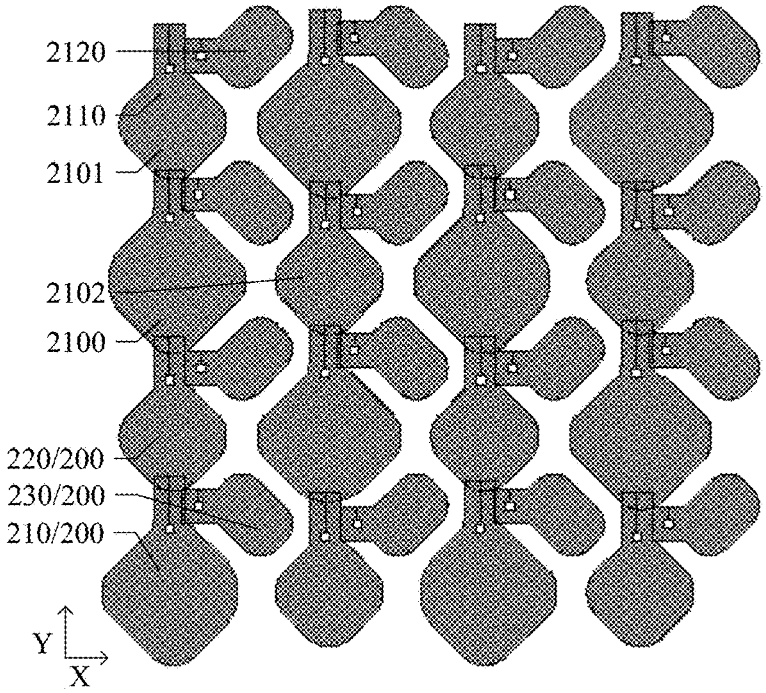
FIG. 8 is a schematic diagram of a partial planar structure of a defining structure in the display substrate shown in FIG. 2 and FIG. 4 to FIG. 7.

FIG. 8 is a schematic diagram of a partial planar structure of a defining structure in the display substrate shown in FIG. 2 and FIG. 4 to FIG. 7.

For example, as shown in FIG. 2 and FIG. 4 to FIG. 8, along the direction perpendicular to the base substrate, a portion where the defining structure 220 overlaps with at least two first openings 410 is an integrated structure.

For example, as shown in FIG. 2 and FIG. 4 to FIG. 8, the plurality of first openings 410 include first openings 410 arranged along the first direction and first openings 410 arranged along the second direction; and the first direction intersects with the second direction. The first direction may be the X direction shown in FIG. 8, and the second direction may be the Y direction shown in FIG. 8, but it is not limited thereto, and the first direction and the second direction may be interchanged.

For example, as shown in FIG. 2 and FIG. 4 to FIG. 8, the defining structure 200 includes a plurality of extension defining structures 2100 arranged along the first direction; and a minimum distance between two adjacent extension defining structures 2100 is less than a minimum distance between two adjacent first openings 410 arranged in the first direction.

For example, as shown in FIG. 2 and FIG. 4 to FIG. 8, the plurality of extension defining structures 2100 include a first sub-extension defining structure 2101 and a second sub-extension defining structure 2102 arranged alternately along the first direction; and a shape of the first sub-extension defining structure 2101 is different from a shape of the second sub-extension defining structure 2102.

For example, as shown in FIG. 2 and FIG. 4 to FIG. 8, adjacent first sub-extension defining structures 2101 have different shapes. One second sub-extension defining structure is provided between the above-described adjacent first sub-extension defining structure. Because the light-emitting region of the first sub-pixel is provided with a specific corner portion, and specific corner portions of light-emitting regions of two adjacent first sub-pixels arranged along the first direction have different positions, adjacent first sub-extension defining structure have different shapes. One second sub-pixel is provided between the above-described two adjacent first sub-pixels arranged along the first direction.

For example, as shown in FIG. 2 and FIG. 4 to FIG. 8, the plurality of sub-pixels 100 include a plurality of pixel groups arranged along the first direction, sub-pixels in each pixel group are arranged along the second direction, and the first direction intersects with the second direction. The defining structure 200 includes a plurality of extension defining structures 2100 arranged along the first direction, an orthographic projection of at least one extension defining structure on the base substrate overlaps with orthographic projections of the first openings 410 corresponding to two adjacent pixel groups on the base substrate, and the two adjacent extension defining structures 2100 are spaced apart.

For example, as shown in FIG. 2 and FIG. 4 to FIG. 8, the extension defining structure 2100 includes a first extension defining structure 2110 overlapping with one of two adjacent pixel groups and a second extension defining structure 2120 overlapping with the other of the two adjacent pixel groups, the first extension defining structure 2110 is a continuous structure extending along the second direction, the second extension defining structure 2120 includes a plurality of sub-structures spaced apart along the second direction; each sub-structure overlaps with a first opening 410 corresponding to one sub-pixel 10, and each sub-structure is connected with the first extension defining structure 2110.

FIG. 8 schematically shows that the portion in the defining structure that overlaps with the first electrodes of the respective sub-pixels and the portion in the defining structure that is exposed by the second opening are an integrated structure, but it is not limited thereto, and the two may also be spaced apart.

Figure 9:
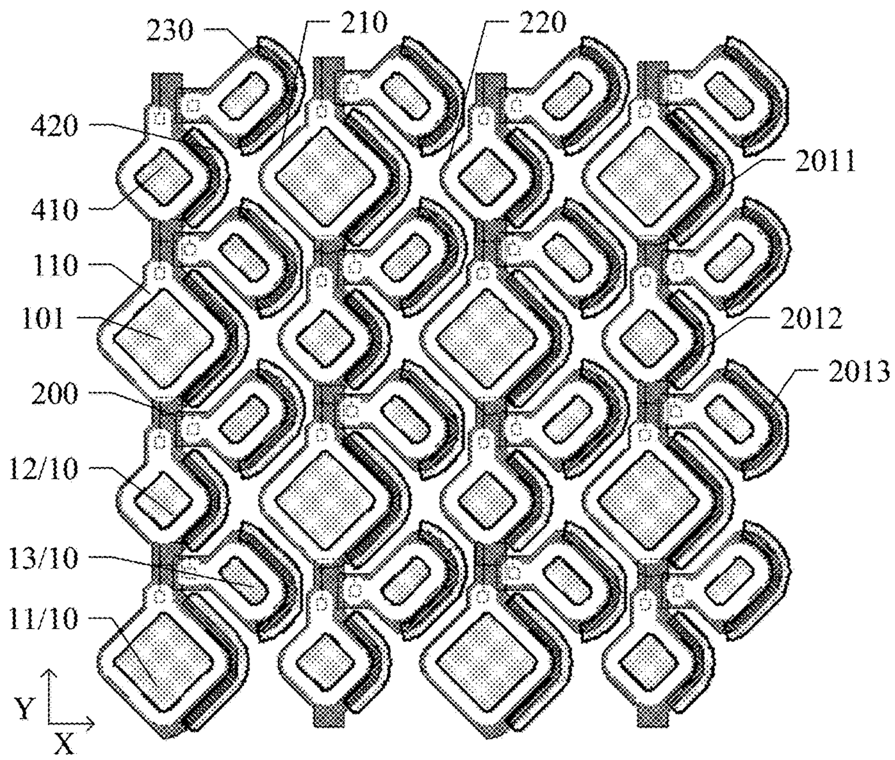
FIG. 9 and FIG. 10 are schematic diagrams of a partial planar structure of the display substrate shown in other examples according to the embodiment of the present disclosure.
Figure 10:
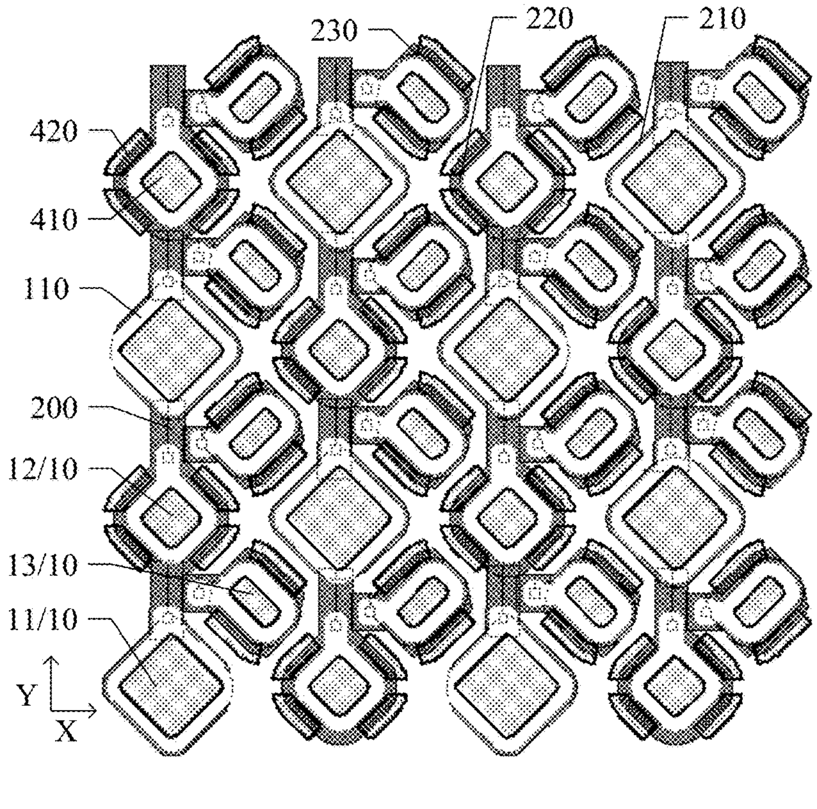

FIG. 9 and FIG. 10 are schematic diagrams of a partial planar structure of the display substrate shown in other examples according to the embodiment of the present disclosure.

The display substrate shown in FIG. 9 differs from the display substrate shown in FIG. 4 in the shape of the light-emitting region 101 of the first sub-pixel 11. As shown in FIG. 9, the light-emitting region 101 of the first sub-pixel 11 includes four corner portions, the respective corner portions have same features, that is, the light-emitting region 101 of the first sub-pixel 11 shown in FIG. 9 does not include the specific corner portion shown in FIG. 4. Except that the shape of the light-emitting region of the first sub-pixel in the display substrate shown in FIG. 9 is different from the shape of the light-emitting region of the first sub-pixel shown in FIG. 4, other features in the display substrate shown in FIG. 9 are the same as other features in the display substrate shown in FIG. 4, and no details will be repeated here.

The display substrate shown in FIG. 10 differs from the display substrate shown in FIG. 2 in the shape of the light-emitting region 101 of the first sub-pixel 11. As shown in FIG. 10, the light-emitting region 101 of the first sub-pixel 11 includes four corner portions, the respective corner portions have same features, that is, the light-emitting region 101 of the first sub-pixel 11 shown in FIG. 10 does not include the specific corner portion shown in FIG. 2. Except that the shape of the light-emitting region of the first sub-pixel in the display substrate shown in FIG. 10 is different from the shape of the light-emitting region of the first sub-pixel shown in FIG. 2, other features in the display substrate shown in FIG. 10 are the same as other features in the display substrate shown in FIG. 2, and no details will be repeated here.

Figure 11:
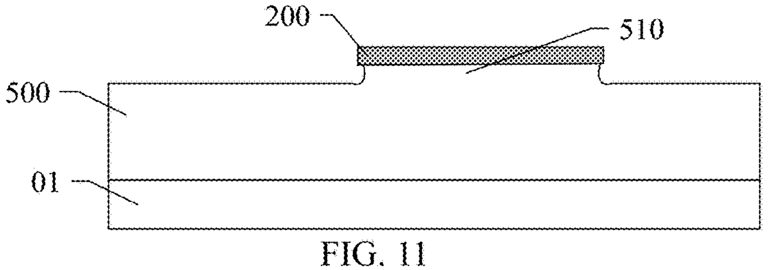
FIG. 11 and FIG. 12 are schematic diagrams of a partial cross-sectional structure of the defining structure and an insulation layer in different examples according to the embodiment of the present disclosure.
Figure 12:
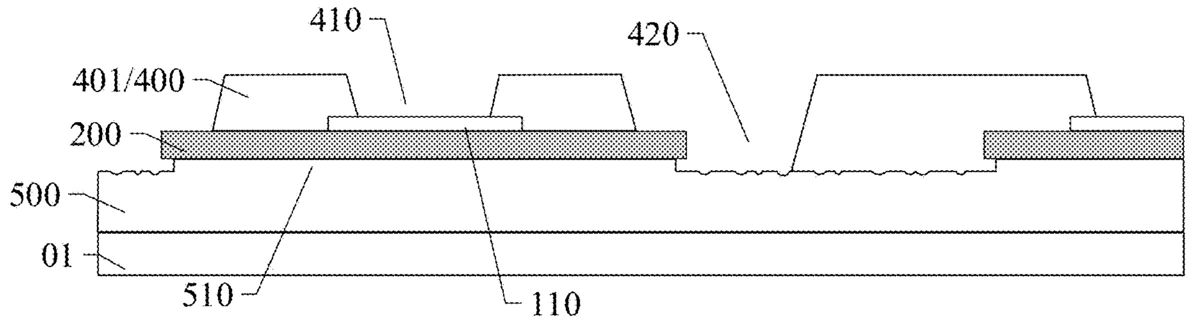

FIG. 11 and FIG. 12 are schematic diagrams of a partial cross-sectional structure of the defining structure and an insulation layer in different examples according to the embodiment of the present disclosure.

For example, as shown in FIG. 11, the insulation layer 500 includes a protruding portion 510 on a side away from the base substrate 01, and an orthographic projection of the protruding portion 510 on the base substrate 01 overlaps with an orthographic projection of the defining structure 200 on the base substrate 01. For example, the defining structure 200 is in contact with the protruding portion 510.

For example, as shown in FIG. 11, the material of the defining structure 200 includes an inorganic non-metallic material and the material of the insulation layer 500 includes an organic material.

For example, as shown in FIG. 11, an edge on at least one side of the defining structure 200 protrudes relative to an edge of a surface on a side of the protruding portion 510 away from the base substrate 01, to isolate the film layer. For example, the edge of the defining structure 200 may also be flush with the edge of the surface on the side of the protruding portion 510 away from the base substrate 01. For example, a size by which at least a portion of the edge of the defining structure 200 protrudes relative to the edge of the surface on the side of the protruding portion 500 away from the base substrate 01 is less than 1 micron, for example, less than 0.08 microns, for example, less than 0.05 microns, for example, less than 0.02 microns.

For example, as shown in FIG. 11, a thickness of the protruding portion 510 may be greater than 500 angstroms. For example, the thickness of the protruding portion 510 may be greater than 1,000 angstroms. For example, the thickness of the protruding portion 510 may be 550 angstroms to 5,000 angstroms. For example, the thickness of the protruding portion 510 may be 500 angstroms to 3,000 angstroms. For example, the thickness of protruding portion 510 may be 600 angstroms to 2,000 angstroms.

For example, as shown in FIG. 12, the defining structure 200 is formed between the first electrode 110 of the sub-pixel and the base substrate 01. For example, before forming the first electrode 110 of the sub-pixel, the defining structure 200 is firstly formed by deposing on the insulation layer 500, for example, a planarization layer; and then the first electrode 110 of the sub-pixel is formed on the defining structure 200. In the display substrate, when forming the defining structure 200 including the isolation portion 210, the planarization layer 500 located at the bottom of the defining structure 200 is etched to form sawteeth. Forming the first electrode on the defining structure may prevent unevenness of the planarization layer that causes a sawteeth problem in the first electrode, thereby reducing a probability of poor display. For example, an orthographic projection of the first electrode 110 on the base substrate 01 may be completely located within the orthographic projection of the defining structure 200 on the base substrate 01.

For example, the protruding portion of the planarization layer may have the same planar shape as the defining structure, for example, the planar shape of the defining structure as shown in FIG. 8, FIG. 15 to FIG. 17; and the edge of the protruding portion may shrink inwards by a certain size relative to the edge of the defining structure, for example, the certain size is the above-described size by which the edge of the surface on the side of the protruding portion 500 away from the base substrate 01 protrudes, for example, the certain size may be less than 1 micron, for example, less than 0.08 microns, for example, less than 0.05 microns, for example, less than 0.02 microns.

For example, positions in the planarization layer without the defining structure arranged may all be the portions shown in FIG. 12 that do not include a protruding portion 510.

Figure 13:
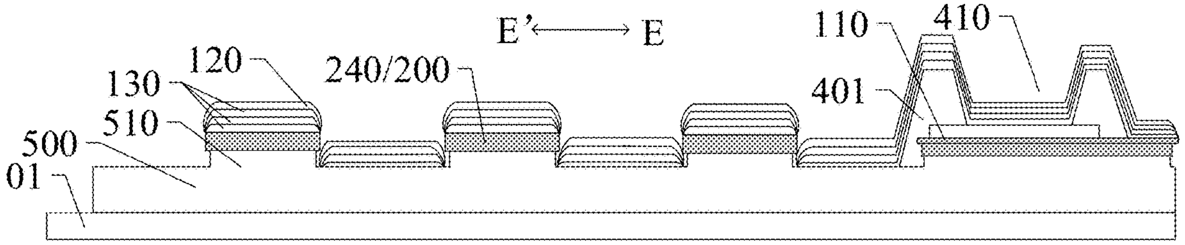
FIG. 13 is a schematic diagram of a partial cross-sectional structure sectioned along an EE' line shown in FIG. 1.

FIG. 13 is a schematic diagram of a partial cross-sectional structure sectioned along an EE' line shown in FIG. 1.

In some examples, as shown in FIG. 1, FIG. 3 and FIG. 13, the base substrate 01 further includes a second region A2. For example, the first region A1 is located in the periphery of the second region A2; for example, the first region may completely surround the second region, or may also only partially surround the second region, or may also only be located on one side of the second region; and the positions of the first region and the second region may be set according to product requirements.

In some examples, as shown in FIG. 1, FIG. 3 and FIG. 13, the defining structure 200 includes at least one loop of closed annular defining structure 240 surrounding the second region A2, and the light-emitting functional layer 130 and the second electrode 120 are both disconnected in an edge position of the annular defining structure 240.

The second region is not provided with sub-pixels for display. By providing at least one loop of annular defining structure in the periphery of the second region for disconnecting the light-emitting functional layer and the second electrode, the light-emitting element located in the first region may be partitioned from the second region, to for isolate water and oxygen from film layers such as the light-emitting functional layer.

For example, as shown in FIG. 1, the first region A1 surrounds at least a portion of the second region A2. For example, the second region A2 shown in FIG. 1 is located in a top center position of the base substrate 01; for example, four sides of the rectangular first region A1 may all surround the second region A2, that is, the second region A2 may be surrounded by the first region A1. For example, the second region A2 may also be located in a position other than the top center position of the base substrate 01 shown in FIG. 1. For example, the second region A2 may be located in an upper left corner position or an upper right corner position of the base substrate 01. For example, the first region A1 may include a display region, and the second region A2 may be a display region or a non-display region, for example, a hole region. For example, the hole region may be provided with a required hardware structure such as a photosensitive sensor. For example, the first region A1 may include a display region away from the second region A2 and a non-display region surrounding the second region A2. For example, the first annular defining structure is located in the display region.

For example, the second region A2 may have a shape of circle, ellipse, or runway (e.g., including two straight edges and two arc edges connecting the two straight edges). But it is not limited thereto, the second region A2 may have a shape of polygon, for example, quadrilateral, hexagon, or octagon. For example, the first region A1 may have a shape of quadrilateral, for example, a rectangle, but it is not limited thereto, and the first region A1 may also have a shape of circle, polygon other than quadrilateral, for example, hexagon, octagon, etc.

In some examples, as shown in FIG. 1, FIG. 3 and FIG. 13, along the direction perpendicular to the base substrate 01, the annular defining structure 240 does not overlap with the pixel defining portion 401.

In some examples, as shown in FIG. 1 and FIG. 13, at least one loop of closed-annular defining structure 240 includes a plurality of loops of annular defining structure 240, a spacing distance between two adjacent loops of annular defining structure 240 is no less than 1 micron. For example, a spacing distance between two adjacent loops of annular defining structure 240 is no less than 2 micron. For example, a spacing distance between two adjacent loops of annular defining structure 240 is no less than 5 micron. For example, a spacing distance between two adjacent loops of annular defining structure 240 is no less than 6 micron, for example, no less than 7 microns, for example, no less than 8 microns, for example, no less than 9 microns, etc.

For example, as shown in FIG. 1, the annular defining structure 240 is located in the first region A1 and surrounds the second region A2, or, the annular defining structure 240 is located in the second region A2 and surrounds a central region of the second region A2. For example, the number of annular defining structures 240 may be three, but it is not limited thereto, and the number of annular defining structures 240 may be one, two, four, or more, which may be set according to product requirements.

For example, as shown in FIG. 1, FIG. 3 and FIG. 13, a portion of the defining structure 200 located in the first region A1 that is exposed by the second opening 420 forms a non-closed ring isolation portion, a portion of the defining structure 200 located in the second region A2 that is not covered by the pixel defining portion 401 forms at least one loop of closed annular defining structure 240. For example, the defining structure 200 located in the first region A1 and the defining structure 200 located in the second region A2 may be formed in the same patterning process, and the defining structures 200 located in the two regions have same features such as material, thickness, etc., but the defining structures 200 located in the two regions have different planar shapes and arrangement.

For example, as shown in FIG. 3 and FIG. 13, the insulation layer 500 may be a planarization (PLN) layer. For example, the annular defining structure 240 is located on a side of the insulation layer 500 away from the base substrate 01. For example, at least a portion of the insulation layer 500 located on a side of the annular defining structure 240 that is close to the second region A2 is removed to isolate water vapor. For example, a minimum distance between an edge of the insulation layer 500 away from the annular defining structure 240 and the annular defining structure 240 is greater than 1 micron.

For example, as shown in FIG. 13, in the direction perpendicular to the base substrate 01, the annular defining structure 240 does not overlap with the pixel defining portion 401. For example, a minimum distance between the annular defining structure 240 and the pixel defining portion 401 is greater than 1 micron. Of course, the embodiment of the present disclosure is not limited thereto; and in the direction perpendicular to the base substrate, a portion of the annular defining structure that is farthest away from the second region may overlap with the pixel defining portion, with an overlapping size less than 1 micron, for example, less than 0.8 microns, for example, less than 0.5 microns, etc.

For example, FIG. 13 schematically shows that the insulation layer 500 is provided between adjacent annular defining structures 240, but it is not limited thereto, and the insulation layer may also be removed between adjacent annular defining structures to further improve a water vapor isolation effect.

Figure 14A:
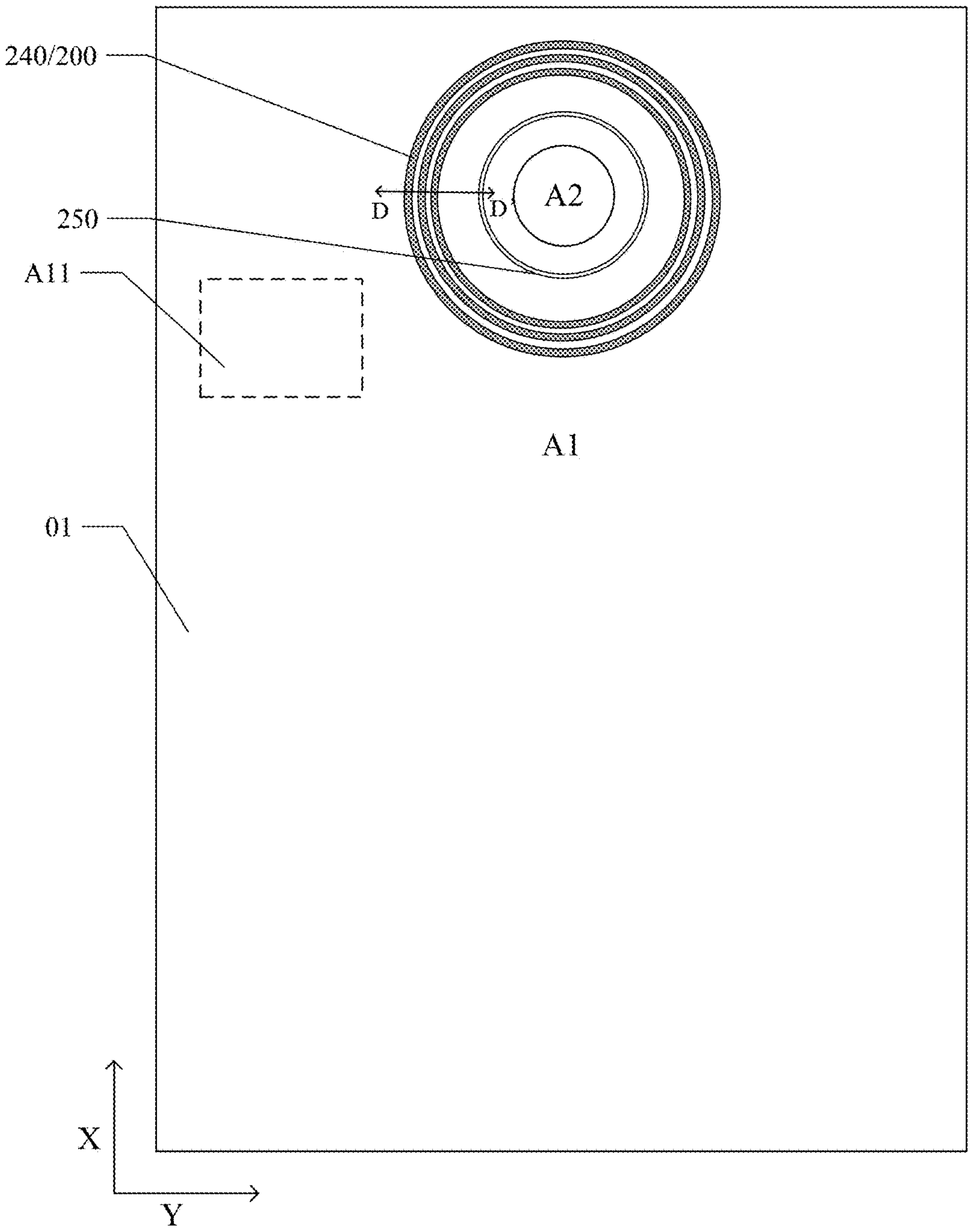
FIG. 14A is a partial plan view of the display substrate provided by another example according to the present disclosure.
Figure 14B:
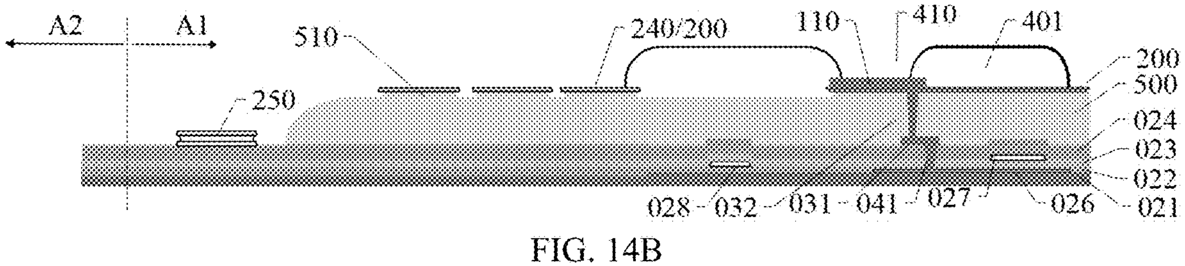
FIG. 14B is a schematic diagram of a partial cross-sectional structure sectioned along a DD' line shown in FIG. 14A.

FIG. 14A is a partial plan view of the display substrate provided by another example according to the present disclosure. FIG. 14B is a schematic diagram of a partial cross-sectional structure sectioned along a DD' line shown in FIG. 14A.

For example, as shown in FIG. 14A and FIG. 14B, the base substrate is provided thereon with a buffer layer and a shielding layer 021, an active layer 026 located on the buffer layer and the shielding layer 021, a gate insulation layer 022 located on the active layer 026, a metal layer 028 located on the gate insulation layer 022, a gate insulation layer 023 located on the metal layer 028, a metal layer 027 located on the gate insulation layer 023, an interlayer insulation layer 024 located on the metal layer 027, a metal layer 031 located on the interlayer insulation layer 024, and a planarization layer 500 located on the metal layer 031. The A1 region may be a region provided with sub-pixels, and the A2 region may be a region surrounded by an annular defining structure 240. FIG. 14B schematically shows that the transistor has a top gate structure, but it is not limited thereto, and the transistor may also have a bottom gate structure, a single gate structure, etc. For example, the metal layer 031 may be a source-drain metal layer, for example, a metal layer electrically connected with a source region and a drain region of the active layer 026.

For example, as shown in FIG. 14A and FIG. 14B, defining structures 200 overlapping with the light-emitting region and surrounding the second region may be formed simultaneously, thereby merging and integrating masks for forming the defining structures in the two positions, which is favorable for reducing the number of masks to further lower costs of producing the display substrate.

For example, as shown in FIG. 14A and FIG. 14B, the annular defining structure 240 is located on a side of the planarization layer 500 away from the base substrate 01. For example, an edge of an outermost annular defining structure 240 away from the center of the second region A2 may be covered by the pixel defining portion 401, but an edge of the outermost annular defining structure 240 that is close to the center of the second region A2 cannot overlap with the pixel defining portion 401, to isolate film layers such as the second electrode.

For example, as shown in FIG. 14A and FIG. 14B, an isolate structure 250 is further provided on a side of the annular defining structure 240 that is close to the center of the second region A2, to further isolate film layers such as the second electrode. For example, the isolate structure 250 may be a ring structure surrounding the second region A2. For example, the isolate structure 250 may be a structure arranged in the same layer as the metal layer 031. For example, the isolate structure 250 may include at least two stacked metal layers, with a metal layer on a side farthest away from the base substrate 01 protruding relative to an edge of a metal layer in contact therewith to implement an isolate effect. For example, the isolate structure 250 may include three metal layers, for example, a titanium/aluminum/titanium structure, to form an I-shaped structure.

For example, as shown in FIG. 14B, in the direction perpendicular to the base substrate 01, the insulation layer 500 does not overlap with the isolate structure 250, and the insulation layer 500 is located on a side of the isolate structure 250 away from the second region A2. For example, a distance between boundaries of the isolate structure 250 and the insulation layer 500 is greater than 1 micron. For example, other insulation layers between the isolate structure 250 and the base substrate 01 are all inorganic insulation layers to improve the water vapor blocking effect.

For example, as shown in FIG. 14B, the isolate structure 250 may include a plurality of loops of ring structure, for example, four loops, six loops, etc.

For example, as shown in FIG. 13 and FIG. 14B, the insulation layer 500 below the annular defining structure 240 includes a protruding portion 510, for example, a loss of the planarization layer.

For example, as shown in FIG. 1, FIG. 13, and FIG. 14A to FIG. 14B, the second region A2 has a shape of circle, and a size of a ring width of the closed annular defining structure 240 is no less than 1 millimeter, for example, the ring width of the annular defining structure 240 may be 3 millimeters. For example, the second region A2 has a shape of runway, for example, the shape of runway includes two long edges and two arc edges connecting the two long edges, a ring width of a portion closely adjacent to the long edge in the annular defining structure 240 is no less than 1 millimeter, and a ring width of a portion closely adjacent to the arc edge in the annular defining structure 240 is no less than 1 millimeter.

For example, as shown in FIG. 1, FIG. 13, and FIG. 14A to FIG. 14B, a minimum distance between the annular defining structure 240 and the defining structure 200 overlapping with the first opening 410 is greater than 1 micron. For example, a minimum distance between boundaries of the defining structure 200 overlapping with the first opening 410 and the pixel defining portion 401 is greater than 1 micron.

For example, as shown in FIG. 13 and FIG. 14B, the annular defining structure 240 may only include one film layer, or may also include a plurality of inorganic layers, which may be set according to product requirements.

Figure 15:
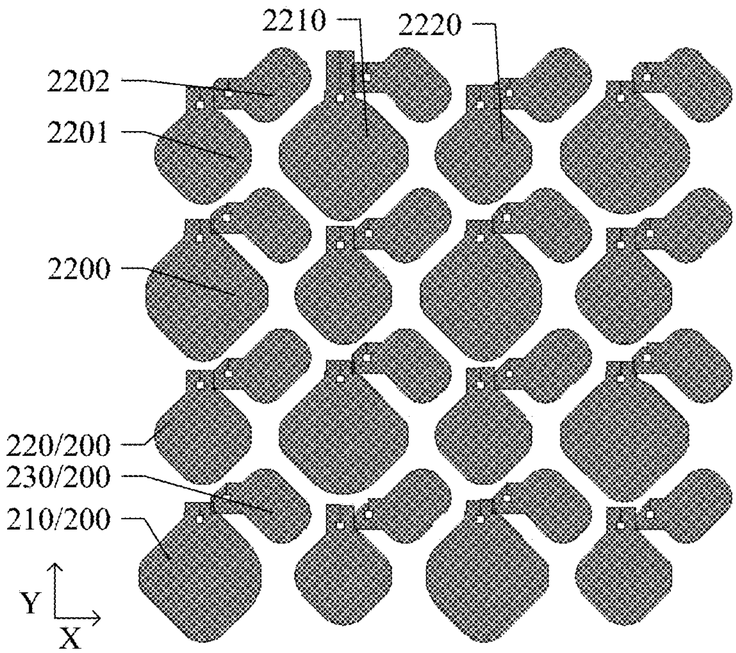
FIG. 15 to FIG. 17 are partial planar structural diagrams of the defining structure shown in other examples according to the embodiment of the present disclosure.
Figure 16:
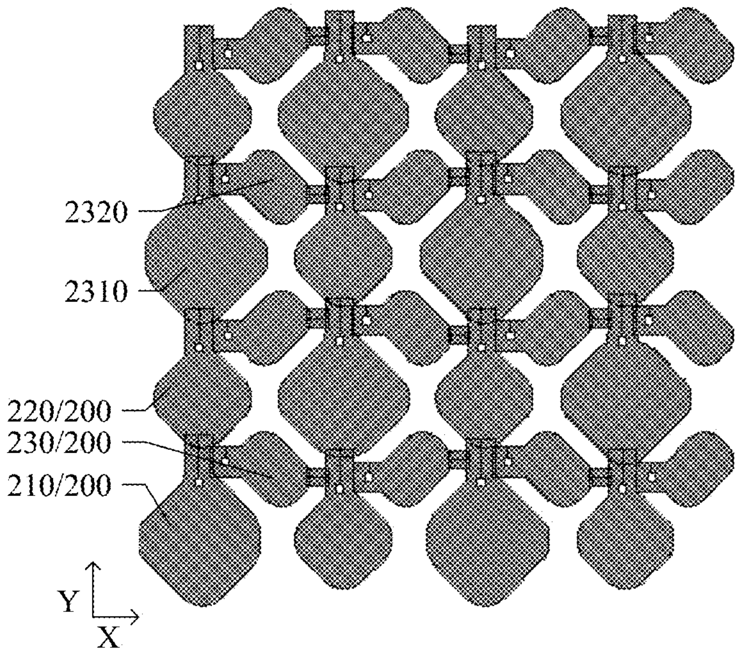
Figure 17:
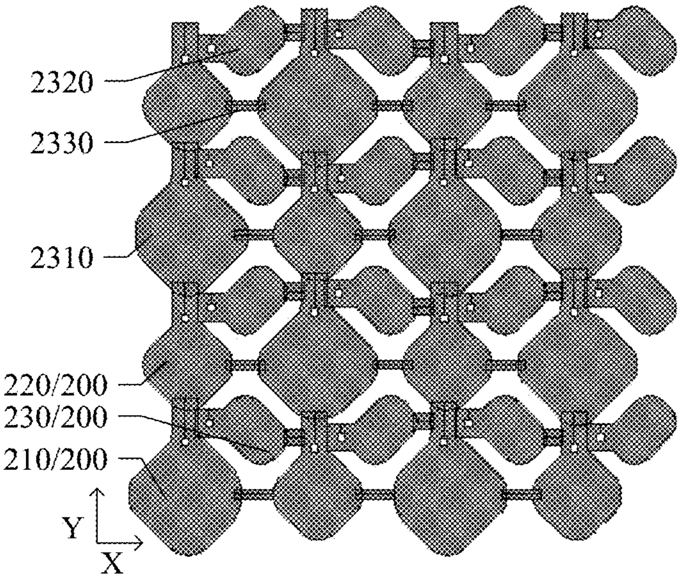

FIG. 15 to FIG. 17 are partial planar structural diagrams of the defining structure shown in other examples according to the embodiment of the present disclosure. The defining structure shown in FIG. 15 to FIG. 17 may be applied to the display substrate shown in FIG. 2, FIG. 4 to FIG. 10, taking that the defining structure shown in FIG. 15 to FIG. 17 is applied to the display substrate shown in FIG. 2 as an example.

For example, as shown in FIG. 15, the defining structure 200 includes a first defining structure 210, a second defining structure 220, and a third defining structure 330.

For example, as shown in FIG. 2 and FIG. 15, the plurality of sub-pixels 10 includes sub-pixels 10 arranged along the first direction and sub-pixels 10 arranged along the second direction; and the first direction intersects with the second direction. The defining structure 200 includes a plurality of defining blocks 2200 arranged in an array; along the direction perpendicular to the base substrate, at least one defining block 2200 overlaps with first openings 410 corresponding to two sub-pixels with different colors 10, a line connecting centers of orthographic projections of the first openings 410 corresponding to the two sub-pixels with different colors 10 on the base substrate intersects with both the first direction and the second direction, and adjacent defining blocks 2200 are spaced apart.

For example, as shown in FIG. 2 and FIG. 15, at least one defining block 2200 includes a first sub-defining block 2201 and a second sub-defining block 2202 that overlap with first openings 410 respectively corresponding to the two sub-pixels with different colors 10, and the first sub-defining block 2201 and the second sub-defining block 2202 are an integrated structure.

For example, as shown in FIG. 2 and FIG. 15, defining blocks 220 arranged along either the first direction or the second direction include first defining blocks 2210 and second defining blocks 2220 alternately arranged; and along the direction perpendicular to the base substrate, a color of light emitted by one of the two sub-pixels with different colors 10 overlapping with the first defining block 2210 is the same as a color of light emitted by one of the two sub-pixels with different colors 10 overlapping with the second defining block 2220.

For example, as shown in FIG. 2 and FIG. 15, the first defining block 2210 overlaps with the light-emitting regions of the first sub-pixel 11 and the third sub-pixel 13, and the second defining block 2220 overlaps with the light-emitting regions of the second sub-pixel 12 and the third sub-pixel 13.

For example, as shown in FIG. 16, the defining structure 200 includes a first defining structure 210, a second defining structure 220, and a third defining structure 330.

For example, as shown in FIG. 2 and FIG. 16, the defining structure 200 includes a plurality of first extension defining structures 2310 arranged along the first direction and a plurality of second extension defining structures 2320 arranged along the second direction, the plurality of first extension defining structures 2310 are connected with the plurality of second extension defining structures 2320 to form a grid-like structure; the first extension defining structure 2310 includes defined overlapping portions overlapping with light-emitting regions of sub-pixels 10 arranged along the second direction, the second extension defining structure 2320 includes defined overlapping portions overlapping with light-emitting regions of sub-pixels arranged along the first direction, and an orthographic projection of the light-emitting region 101 of the sub-pixel 10 on the base substrate is completely within an orthographic projection of the defined overlapping portion on the base substrate.

For example, as shown in FIG. 16, the first extension defining structure 2310 includes first defining structures 210 and second defining structures 220 alternately arranged, and a connection structure is provided between the first defining structure 210 and the second defining structure 220 adjacent to each other; the second extension defining structure 2320 includes a plurality of third defining structures 230 arranged along the first direction, and a connection structure is provided between adjacent third defining structures 230.

For example, as shown in FIG. 17, the defining structure 200 includes a first defining structure 210, a second defining structure 220, and a third defining structure 230.

For example, the defining structure shown in FIG. 17 differs from the defining structure shown in FIG. 16 in that a connection structure 2330 is provided between the first defining structure 210 and the second defining structure 220 adjacent to each other arranged along the X direction.

Figure 18:
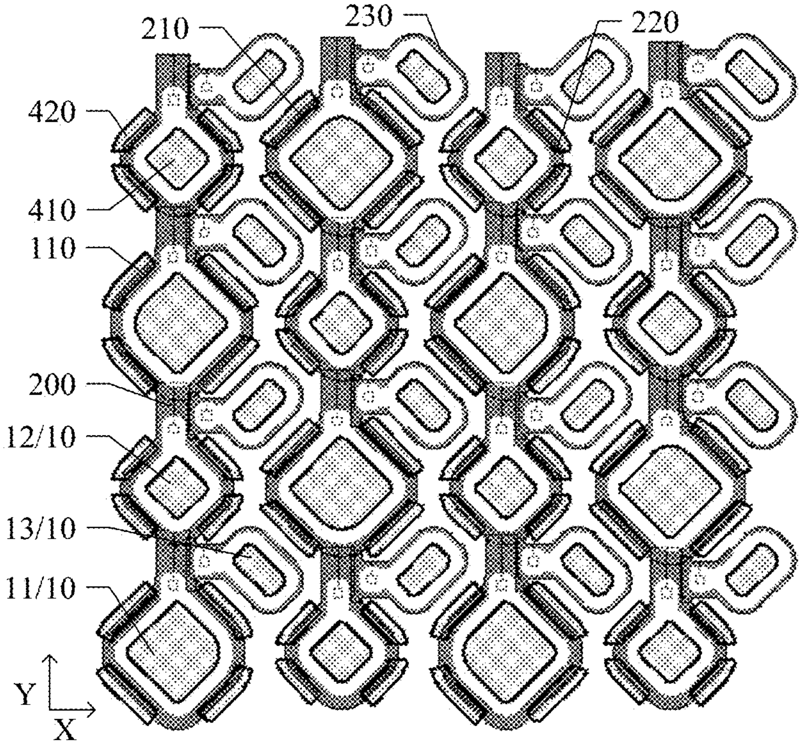
FIG. 18 is a schematic diagram of a partial planar structure of the display substrate provided by another example according to the embodiment of the present disclosure.

FIG. 18 is a schematic diagram of a partial planar structure of the display substrate provided by another example according to the embodiment of the present disclosure.

The display substrate shown in FIG. 18 differs from the display substrate shown in FIG. 2 in that the second opening 420 is configured to expose a portion of an edge of the first defining structure 210 and a portion of an edge of the second defining structure 220; and the third defining structure 230 does not overlap with the second opening 420.

Another embodiment of the present disclosure provides a display substrate; the display substrate includes a base substrate, as well as a plurality of sub-pixels, a pixel defining pattern, and a defining structure located on the base substrate. The base substrate at least includes a first region; the plurality of sub-pixels is located in the first region; each sub-pixel among at least some sub-pixels includes a light-emitting functional layer, and the light-emitting functional layer includes a plurality of film layers. The pixel defining pattern includes a plurality of first openings to define light-emitting regions of at least some sub-pixels; the defining structure is located between the light-emitting functional layer and the base substrate, and the defining structure includes a portion surrounding a light-emitting region of each sub-pixel among the at least some sub-pixels. The pixel defining pattern further includes second openings; a portion of at least one layer in the light-emitting functional layer that is located in the first opening is a continuous portion, at least a portion located in at least one second opening is isolated; a portion in the defining structure that is exposed by the second opening is configured to isolate at least one layer of the light-emitting functional layer. The plurality of sub-pixels include a first sub-pixel and a second sub-pixel, a turn-on voltage of the first sub-pixel is higher than a turn-on voltage of the second sub-pixel; a distance between an edge of a light-emitting region of the first sub-pixel and a second opening closest to the edge of the light-emitting region is a first distance, a distance between an edge of a light-emitting region of the second sub-pixel and a second opening closely adjacent to the edge of the light-emitting region is a second distance, the first distance is greater than the second distance; or, the defining structure includes a first defining structure and a second defining structure; the first defining structure includes a portion surrounding the light-emitting region of the first sub-pixel, and the second defining structure includes a portion surrounding the light-emitting region of the second sub-pixel; a proportion of the portion in the first defining structure that is exposed by the second opening to the first defining structure is less than a proportion of the portion in the second defining structure that is exposed by the second opening to the second defining structure.

In the display substrate provided by the present disclosure, the edge of the light-emitting region of the first sub-pixel with a higher turn-on voltage is set to have a greater distance from the second opening, or the portion of the first defining structure corresponding to the first sub-pixel that is exposed by the second opening is set to be smaller, so that the second electrode of the first sub-pixel has a conductive channel with a larger area, which improves a conductive effect of the second electrode of the first sub-pixel, and is favorable for avoiding excessive power consumption and brightness uniformity problems of the display substrate.

FIG. 1 to FIG. 17 may be applicable to the display substrate provided by this embodiment. As shown in FIG. 1 to FIG. 3, the display substrate includes a base substrate 01, as well as a plurality of sub-pixels 10, a pixel defining pattern 400, and a defining structure 200 located on the base substrate 01. The base substrate 01 at least includes a first region A1; the plurality of sub-pixels 10 is located in the first region A1; each sub-pixel 10 among at least some sub-pixels 10 includes a light-emitting functional layer 130, and the light-emitting functional layer 130 includes a plurality of film layers.

The sub-pixels provided by this embodiment have same features as the sub-pixels provided by the above-described embodiments, for example, including the light-emitting functional layer 130 and the first electrode 110 and the second electrode 120 located on both sides of the light-emitting functional layer 130 along the direction perpendicular to the base substrate 01, and no details will be repeated here.

As shown in FIG. 2 to FIG. 3, the pixel defining pattern 400 is located on a side of the first electrode 110 away from the base substrate 01, and the pixel defining pattern 400 includes a plurality of first openings 410 to define light-emitting regions 101 of at least some sub-pixels 10. The pixel defining pattern 400 further includes second openings 420; a portion of at least one layer in the light-emitting functional layer 130 that is located in the first opening 410 is a continuous portion, at least a portion located in the at least one second opening 420 is isolated; and a portion in the defining structure 200 that is exposed by the second opening 420 is configured to isolate at least one layer of the light-emitting functional layer 130.

As shown in FIG. 2 to FIG. 3, the defining structure 200 is located between the light-emitting functional layer 130 and the base substrate 01, and the defining structure 200 includes a portion surrounding a light-emitting region 11 of each sub-pixel 10 among the at least some sub-pixels 10.

Features such as structures included in the defining structure, positional relationships between the defining structure and the first opening and the second opening, etc. according to this embodiment may be the same as the corresponding features according to the above-described embodiments, and no details will be repeated here.

As shown in FIG. 2 to FIG. 3, the plurality of sub-pixels 10 includes a first sub-pixel 11 and a second sub-pixel 12, a turn-on voltage of the first sub-pixel 11 is higher than a turn-on voltage of the second sub-pixel 12; a distance between an edge of a light-emitting region of the first sub-pixel 11 (e.g., an edge of a region defined by the first opening 410) and a second opening 420 closest to the edge of the light-emitting region is a first distance D1, a distance between an edge of a light-emitting region of the second sub-pixel 12 and a second opening 420 closely adjacent to the edge of the light-emitting region is a second distance D2, and the first distance D1 is greater than the second distance D2.

As shown in FIG. 2 to FIG. 3, the defining structure 200 includes a first defining structure 210 and a second defining structure 220; the first defining structure 210 includes a portion surrounding the light-emitting region 101 of the first sub-pixel 11, the second defining structure 220 includes a portion surrounding the light-emitting region 101 of the second sub-pixel 12; a second opening 420 closest to the edge of the light-emitting region of the second sub-pixel 12 is a second opening 420 that exposes the second defining structure 220, and does not expose the first defining structure 11.

In the display substrate provided by the present disclosure, the edge of the light-emitting region of the first sub-pixel with a higher turn-on voltage is set to have a greater distance from the second opening, so that the second electrode of the first sub-pixel has a conductive channel with a larger area, which improves a conductive effect of the second electrode of the first sub-pixel, and is favorable for avoiding excessive power consumption and brightness uniformity problems of the display substrate.

For example, as shown in FIG. 2, the plurality of sub-pixels 10 further includes a third sub-pixel 13; the defining structure 200 further includes a third defining structure 230, the third defining structure 230 includes a portion surrounding a light-emitting region 101 of the third sub-pixel 13; and a minimum distance between the second opening 420 configured to expose the second defining structure 220 and an edge of the light-emitting region of the third sub-pixel 13 is greater than the second distance D2. For example, the second opening 420 configured to expose the second defining structure 220 does not expose the third defining structure 230.

In some examples, as shown in FIG. 2 and FIG. 3, the second opening 420 is provided between the first sub-pixel 11 and the third sub-pixel 13; a distance between the edge of the light-emitting region of the first sub-pixel 11 and the second opening 420 is a third distance D3, a distance between the edge of the light-emitting region of the third sub-pixel 13 and the second opening 420 is a fourth distance D4, and the third distance D3 is greater than the fourth distance D4. For example, the second opening 420 is a second opening 420 that exposes the third defining structure 230, and the second opening 420 does not expose the first defining structure 210.

In some examples, as shown in FIG. 2, the turn-on voltage of the first sub-pixel 11 is 0.1 V to 5 V higher than the turn-on voltage of the second sub-pixel 12. Relationships among the turn-on voltage of the first sub-pixel, the turn-on voltage of the second sub-pixel, and the turn-on voltage of the third sub-pixel according to this embodiment may have the same features as the above-described embodiments, and no details will be repeated here.

In some examples, as shown in FIG. 2, a portion of the second defining structure 220 that is exposed by the second opening 420 is a non-closed ring structure, a proportion of the non-closed ring structure to a perimeter of the second defining structure 220 is 10% to 80%. As shown in FIG. 2, a portion of the third defining structure 230 that is exposed by the second opening 420 is a non-closed ring structure, and a proportion of the non-closed ring structure to a perimeter of the third defining structure 230 is 10% to 80%.

As shown in FIG. 4, a proportion of the portion in the first defining structure 210 that is exposed by the second opening 420 to the first defining structure 210 is less than a proportion of the portion in the second defining structure 220 that is exposed by the second opening 420 to the second defining structure 220.

In some examples, as shown in FIG. 4, the proportion of the portion in the first defining structure 210 that is exposed by the second opening 420 to the first defining structure 210 is less than a proportion of the portion in the third defining structure 230 that is exposed by the second opening 420 to the third defining structure 230.

The relationship between the first defining structure and the second opening, the relationship between the second defining structure and the second opening, and the relationship between the third defining structure and the second opening according to this embodiment may have the same features as the corresponding relationships in any example according to the above-described embodiments, and no details will be repeated here.

In some examples, as shown in FIG. 1, FIG. 3 and FIG. 13, the base substrate 01 further includes a second region A2, the first region A1 is located in the periphery of the second region A2; the defining structure 200 includes at least one loop of closed annular defining structure 240 surrounding the second region A2; and the light-emitting functional layer 130 and the second electrode 120 are both disconnected in the edge position of the annular defining structure 240.

The second region and the annular defining structure arranged in the second region according to this embodiment may have the same features as the second region and the annular defining structure arranged in the second region according to the above-described embodiment, and no details will be repeated here.

Another embodiment of the present disclosure provides a display substrate; the display substrate includes: a base substrate, at least including a first region; a plurality of sub-pixels, located in the first region, each sub-pixel among at least some sub-pixels including a light-emitting functional layer, the light-emitting functional layer including a plurality of film layers; a pixel defining pattern located on the base substrate, the pixel defining pattern including a plurality of first openings to define light-emitting regions of the at least some sub-pixels; a defining structure, located between the light-emitting functional layer and the base substrate, the defining structure including a portion surrounding a light-emitting region of each sub-pixel among the at least some sub-pixels, in which the pixel defining pattern further includes second openings, a portion of at least one layer in the light-emitting functional layer that is located in the first opening is a continuous portion, at least a portion located in at least one second opening is isolated, and a portion in the defining structure that is exposed by the second opening is configured to isolate at least one layer of the light-emitting functional layer; the plurality of sub-pixels include a first sub-pixel and a second sub-pixel, an aperture ratio of the first sub-pixel is greater than an aperture ratio of the second sub-pixel; the defining structure includes a first defining structure and a second defining structure; the first defining structure at least includes a portion surrounding the light-emitting region of the first sub-pixel, the second defining structure at least includes a portion surrounding the light-emitting region of the second sub-pixel; the first defining structure is not exposed by the second opening, or a proportion of an edge perimeter of the portion in the first defining structure that is exposed by the second opening to a perimeter of the first opening surrounded by the first defining structure is less than a proportion of an edge perimeter of the portion in the second defining structure that is exposed by the second opening to a perimeter of the first opening surrounded by the second defining structure, or, a distance between an edge of the light-emitting region of the first sub-pixel and the second opening closest to the edge of the light-emitting region is a first distance, a distance between an edge of the light-emitting region of the second sub-pixel and a second opening closely adjacent to the edge of the light-emitting region is a second distance, and the first distance is greater than the second distance.

For example, luminous efficiency of the first sub-pixel is lower than luminous efficiency of the second sub-pixel.

For example, service life of the first sub-pixel is shorter than service life of the second sub-pixel.

Because the first sub-pixel has lower luminous efficiency and shorter service life, an aperture ratio of the first sub-pixel is set to a greater value, which is favorable for reducing voltage drop of the first sub-pixel. In the display substrate provided by the present disclosure, the first defining structure in the periphery of the first sub-pixel with a higher aperture ratio is set to be not exposed by the second opening or to have less portion exposed by the second opening, so that the second electrode of the first sub-pixel has a conductive channel with a larger area, which improves a conductive effect of the second electrode of the first sub-pixel, and is favorable for avoiding excessive power consumption and brightness uniformity problems of the display substrate.

For example, the first sub-pixel may include a fluorescent light-emitting device, and the second sub-pixel may include a phosphorescent light-emitting device. For example, the first sub-pixel may be a blue sub-pixel, and the second sub-pixel may be a red sub-pixel or a green sub-pixel.

For example, a wavelength of light emitted by the first sub-pixel is shorter than a wavelength of light emitted by the second sub-pixel. For example, the first sub-pixel emits blue light, and the second sub-pixel emits green light or red light.

For example, power consumption required for the first sub-pixel to emit light is greater than power consumption required for the second sub-pixel to emit light.

Features of the respective sub-pixels and features of the defining structure and the pixel defining patterns according to this embodiment may be the same as the corresponding features according to any one of the above-described embodiments, and no details will be repeated here.

Another embodiment of the present disclosure provides a display substrate; the display substrate includes: a base substrate, including a first region and a second region, the first region being located in the periphery of the second region; a plurality of sub-pixels, located in the first region, each sub-pixel among at least some sub-pixels including a light-emitting functional layer as well as a first electrode and a second electrode located on both sides of the light-emitting functional layer along a direction perpendicular to the base substrate, the first electrode being located between the light-emitting functional layer and the base substrate, and the light-emitting functional layer including a plurality of film layers; a pixel defining pattern, located on a side of the first electrode away from the base substrate, the pixel defining pattern including a plurality of first openings to define light-emitting regions of the at least some sub-pixels; a defining structure, located between the light-emitting functional layer and the base substrate, the defining structure including a portion surrounding a light-emitting region of each sub-pixel among the at least some sub-pixels; in which the pixel defining pattern further includes second openings, at least one layer in the light-emitting functional layer that is located in the first opening is a continuous portion, at least a portion located in at least one second opening is isolated; a portion in the defining structure that is exposed by the second opening is configured to isolate at least one layer of the light-emitting functional layer; the defining structure includes at least one loop of closed annular defining structure surrounding the second region, and the light-emitting functional layer and the second electrode are both disconnected in an edge position of the annular defining structure.

In the display substrate provided by the present disclosure, the second region is not provided with sub-pixels for emitting light; and at least one loop of annular defining structure for disconnecting the light-emitting functional layer and the second electrode is arranged in the periphery of the second region, which may partition the light-emitting element located in the first region from the second region, to isolate water oxygen from the film layer such as the light-emitting functional layer.

For example, the pixel defining pattern includes a pixel defining portion surrounding the first opening and the second opening; and along a direction perpendicular to the base substrate, the annular defining structure does not overlap with the pixel defining portion.

For example, the at least one loop of closed annular defining structure includes a plurality of loops of annular defining structures, and a spacing distance between two adjacent loops of annular defining structures is no less than 5 microns.

For example, the plurality of sub-pixels include a first sub-pixel and a second sub-pixel; the defining structure includes a first defining structure and a second defining structure; the first defining structure at least includes a portion surrounding the light-emitting region of the first sub-pixel, the second defining structure at least includes a portion surrounding the light-emitting region of the second sub-pixel, and the portion of the second defining structure that is exposed by the second opening is a non-closed ring structure.

For example, the first defining structure is not exposed by the second opening, or the portion of the first defining structure that is exposed by the second opening is a non-closed ring structure.

For example, a turn-on voltage of the first sub-pixel is higher than a turn-on voltage of the second sub-pixel.

For example, a proportion of an edge perimeter of the portion in the first defining structure that is exposed by the second opening to a perimeter of the first opening surrounded by the first defining structure is less than a proportion of an edge perimeter of the portion in the second defining structure that is exposed by the second opening to a perimeter of the first opening surrounded by the second defining structure.

For example, a minimum distance between a boundary of the defining structure overlapping with the first opening and a boundary of the annular defining structure is greater than 1 micron.

For example, a minimum distance between boundaries of the annular defining structure and the pixel defining portion is greater than 1 micron.

For example, a planarization layer is provided between the pixel defining portion and the base substrate, and a minimum distance between boundaries of the annular defining structure and the planarization layer is greater than 1 micron.

Features of the respective sub-pixels and features of the defining structure and the pixel defining patterns according to this embodiment may be the same as the corresponding features according to any one of the above-described embodiments, and no details will be repeated here.

Another embodiment of the present disclosure provides a display apparatus, and the display apparatus includes any one of the above-described display substrates.

For example, the display apparatus further includes a cover plate located on a light exiting side of the display substrate.

For example, the display apparatus may be a display device such as an organic light-emitting diode display apparatus, as well as a television, a digital camera, a mobile phone, a watch, a tablet computer, a laptop, a navigator, and any other product or component having a display function including the display apparatus, and this embodiment is not limited thereto.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined.

What have been described above are only specific implementations of the present disclosure, the protection scope of the present disclosure is not limited thereto. The protection scope of the present disclosure should be based on the protection scope of the claims.

The invention claimed is:

1. A display substrate, comprising:

a base substrate, at least comprising a first region;

a plurality of sub-pixels, located in the first region, each sub-pixel among at least some sub-pixels comprising a light-emitting functional layer, and the light-emitting functional layer comprising a plurality of film layers;

a pixel defining pattern, located on the base substrate, the pixel defining pattern comprising a plurality of first openings to define light-emitting regions of the at least some sub-pixels;

a defining structure, located between the light-emitting functional layer and the base substrate, the defining structure comprising a portion surrounding a light-emitting region of each sub-pixel among the at least some sub-pixels, wherein the pixel defining pattern further comprises second openings, a portion of at least one layer in the light-emitting functional layer that is located in the first opening is a continuous portion, at least a portion of the at least one layer in the light-emitting functional layer that is located in at least one second opening is isolated, and a portion in the defining structure that is exposed by the second opening is configured to isolate the at least one layer of the light-emitting functional layer;

the plurality of sub-pixels comprises a first sub-pixel and a second sub-pixel, a turn-on voltage of the first sub-pixel is higher than a turn-on voltage of the second sub-pixel, the defining structure comprises a first defining structure and a second defining structure, the first defining structure at least comprises a portion surrounding a light-emitting region of the first sub-pixel, and the second defining structure at least comprises a portion surrounding a light-emitting region of the second sub-pixel;

the first defining structure is not exposed by the second opening, or a proportion of an edge length of a portion in the first defining structure that is exposed by the second opening to a perimeter of the first opening corresponding to the first sub-pixel is less than a proportion of an edge length of a portion in the second defining structure that is exposed by the second opening to a perimeter of the first opening corresponding to the second sub-pixel.

2. The display substrate according to claim 1, wherein the turn-on voltage of the first sub-pixel is 0.1 V to 5 V higher than the turn-on voltage of the second sub-pixel.

3. The display substrate according to claim 1, wherein a portion of the second defining structure that is exposed by the second opening is a non-closed ring structure, and a proportion of the non-closed ring structure to the perimeter of the first opening corresponding to the second sub-pixel ranges from 10% to 80%.

4. The display substrate according to claim 1, wherein the plurality of sub-pixels further comprises a third sub-pixel, the defining structure further comprises a third defining structure, the third defining structure comprises a portion surrounding a light-emitting region of the third sub-pixel; the third defining structure is not exposed by the second opening, or the proportion of the edge length of the portion in the first defining structure that is exposed by the second opening to the perimeter of the first opening corresponding to the first sub-pixel is less than a proportion of an edge length of a portion in the third defining structure that is exposed by the second opening to a perimeter of the first opening corresponding to the third sub-pixel.

5. The display substrate according to claim 4, wherein the portion of the third defining structure that is exposed by the second opening is a non-closed ring structure, and a proportion of the non-closed ring structure to the perimeter of the first opening corresponding to the third sub-pixel ranges from 10% to 80%.

6. The display substrate according to claim 4, wherein the first sub-pixel is a blue sub-pixel, one of the second sub-pixel and the third sub-pixel is a red sub-pixel, and the other of the second sub-pixel and the third sub-pixel is a green sub-pixel.

7. The display substrate according to claim 1, wherein each sub-pixel among the at least some sub-pixels further comprises a first electrode and a second electrode located on both sides of the light-emitting functional layer along a direction perpendicular to the base substrate, the first electrode is located between the light-emitting functional layer and the base substrate, and the pixel defining pattern is located on a side of the first electrode away from the base substrate;

the defining structure is located between the first electrode and the base substrate.

8. The display substrate according to claim 1, wherein the pixel defining pattern comprises a pixel defining portion surrounding the first opening and the second opening; along a direction perpendicular to the base substrate, at least a portion of the pixel defining portion does not overlap with the defining structure.

9. The display substrate according to claim 1, wherein each sub-pixel among the at least some sub-pixels further comprises a first electrode and a second electrode located on both sides of the light-emitting functional layer along a direction perpendicular to the base substrate, the first electrode is located between the light-emitting functional layer and the base substrate, and the pixel defining pattern is located on a side of the first electrode away from the base substrate;

the first defining structure is not exposed by the second opening, a ring width of a ring portion of the first defining structure that is not covered by the first electrode of the first sub-pixel is less than a ring width of a ring portion of the second defining structure that is not covered by the first electrode of the second sub-pixel.

10. The display substrate according to claim 1, wherein each sub-pixel among the at least some sub-pixels further comprises a first electrode and a second electrode located on both sides of the light-emitting functional layer along a direction perpendicular to the base substrate, the first electrode is located between the light-emitting functional layer and the base substrate, and the pixel defining pattern is located on a side of the first electrode away from the base substrate;

the proportion of the edge length of the portion in the first defining structure that is exposed by the second opening to the perimeter of the first opening corresponding to the first sub-pixel is less than the proportion of the edge length of the portion in the second defining structure that is exposed by the second opening to the perimeter of the first opening corresponding to the second sub-pixel; a ring width of a portion having no overlapping portion with the second opening in a ring portion of the first defining structure that is not covered by the first electrode of the first sub-pixel is a first ring width, a ring width of a portion having an overlapping portion with the second opening in the ring portion of the first defining structure is a second ring width, and the first ring width is less than the second ring width.

11. The display substrate according to claim 1, wherein each sub-pixel among the at least some sub-pixels further comprises a first electrode and a second electrode located on both sides of the light-emitting functional layer along a direction perpendicular to the base substrate, the first electrode is located between the light-emitting functional layer and the base substrate, and the pixel defining pattern is located on a side of the first electrode away from the base substrate;

the base substrate further comprises a second region, the defining structure comprises at least one loop of annular defining structure that is closed around the second region, and the light-emitting functional layer and the second electrode are both disconnected in an edge position of the annular defining structure.

12. The display substrate according to claim 11, wherein the pixel defining pattern comprises a pixel defining portion surrounding the first opening and the second opening, and along the direction perpendicular to the base substrate, at least a portion of the annular defining structure does not overlap with the pixel defining portion.

13. The display substrate according to claim 11, wherein the at least one loop of closed annular defining structure comprises a plurality of loops of annular defining structures, and an interval between two adjacent loops of annular defining structures is no less than 1 micron.

14. The display substrate according to claim 1, wherein the defining structure comprises a first isolation layer and a second isolation layer stacked, the first isolation layer is located on a side of the second isolation layer away from the base substrate, and an edge of the first isolation layer protrudes relative to an edge of the second isolation layer, a material of the first isolation layer is different from a material of the second isolation layer, the material of the first isolation layer comprises an inorganic non-metallic material or a metallic material, and the material of the second isolation layer comprises an organic material or an inorganic non-metallic material.

15. The display substrate according to claim 1, wherein the plurality of sub-pixels further comprises a third sub-pixel; the plurality of sub-pixels is arranged into a plurality of first sub-pixel groups and a plurality of second sub-pixel groups arranged alternately along a first direction; the respective first sub-pixel groups each comprise first sub-pixels and second sub-pixels arranged alternately along a second direction, the respective second sub-pixel groups each comprise third sub-pixels arranged along the second direction; and the first direction intersects with the second direction.

16. The display substrate according to claim 15, wherein the defining structure further comprises a third defining structure; the first defining structure comprises a non-closed ring first isolation portion surrounding the light-emitting region of the first sub-pixel, the second defining structure comprises a non-closed ring second isolation portion surrounding the light-emitting region of the second sub-pixel, and the third defining structure comprises a non-closed ring third isolation portion surrounding the light-emitting region of the third sub-pixel;

shapes of the light-emitting regions of the first sub-pixel, the second sub-pixel, and the third sub-pixel are all quadrilaterals; the first isolation portion surrounds two adjacent edges of the light-emitting region of the first sub-pixel and a first corner portion formed by connecting the two adjacent edges, or the first isolation portion surrounds a portion of two adjacent edges of the light-emitting region of the first sub-pixel except a first corner portion formed by connecting the two adjacent edges; the second isolation portion surrounds two adjacent edges of the light-emitting region of the second sub-pixel and a second corner portion formed by connecting the two adjacent edges; the third isolation portion surrounds two adjacent edges of the light-emitting region of the third sub-pixel and a third corner portion formed by connecting the two adjacent edges; and orientations of the first corner portion, the second corner portion, and the third corner portion are all the same; or the second defining structure comprises a non-closed ring second isolation portion surrounding the light-emitting region of the second sub-pixel; shapes of the light-emitting regions of the first sub-pixel, the second sub-pixel, and the third sub-pixel are all quadrilaterals, and the second isolation portion surrounds four edges of the light-emitting region of the second sub-pixel; the defining structure further comprises a third defining structure, the third defining structure comprises a non-closed ring third isolation portion surrounding the light-emitting region of the third sub-pixel, and the third isolation portion surrounds two edges of the light-emitting region of the third sub-pixel that are closely adjacent to the light-emitting region of the first sub-pixel; or the second defining structure comprises a non-closed ring second isolation portion surrounding the light-emitting region of the second sub-pixel; the defining structure further comprises a third defining structure, and the third defining structure comprises a non-closed ring third isolation portion surrounding the light-emitting region of the third sub-pixel; shapes of the light-emitting regions of the first sub-pixel, the second sub-pixel, and the third sub-pixel are all quadrilaterals;

the second isolation portion surrounds two adjacent edges of the light-emitting region of the second sub-pixel and a second corner portion formed by connecting the two adjacent edges, the third isolation portion surrounds two adjacent edges of the light-emitting region of the third sub-pixel and a third corner portion formed by connecting the two adjacent edges; and orientations of the second corner portion and the third corner portion are both the same.

17. A display apparatus, comprising the display substrate according to claim 1.

18. A display substrate, comprising:

a base substrate, at least comprising a first region;

a plurality of sub-pixels, located in the first region, each sub-pixel among at least some sub-pixels comprising a light-emitting functional layer, and the light-emitting functional layer comprising a plurality of film layers;

a pixel defining pattern, located on the base substrate, the pixel defining pattern comprising a plurality of first openings to define light-emitting regions of the at least some sub-pixels;

a defining structure, located between the light-emitting functional layer and the base substrate, the defining structure comprising a portion surrounding a light-emitting region of each sub-pixel among the at least some sub-pixels, wherein the pixel defining pattern further comprises second openings, a portion of at least one layer in the light-emitting functional layer that is located in the first opening is a continuous portion, at least a portion of the at least one layer in the light-emitting functional layer that is located in at least one second opening is isolated, and a portion in the defining structure that is exposed by the second opening is configured to isolate the at least one layer of the light-emitting functional layer;

the plurality of sub-pixels comprises a first sub-pixel and a second sub-pixel, a turn-on voltage of the first sub-pixel is higher than a turn-on voltage of the second sub-pixel;

a distance between an edge of a light-emitting region of the first sub-pixel and a second opening closest to the edge of the light-emitting region of the first sub-pixel is a first distance, a distance between an edge of a light-emitting region of the second sub-pixel and a second opening closely adjacent to the edge of the light-emitting region of the second sub-pixel is a second distance, and the first distance is greater than the second distance; or, the defining structure comprises a first defining structure and a second defining structure, the first defining structure at least comprises a portion surrounding the light-emitting region of the first sub-pixel, and the second defining structure at least comprises a portion surrounding the light-emitting region of the second sub-pixel; a proportion of an edge length of a portion in the first defining structure that is exposed by the second opening to a perimeter of the first opening corresponding to the first sub-pixel is less than a proportion of an edge length of a portion in the second defining structure that is exposed by the second opening to a perimeter of the first opening corresponding to the second sub-pixel.

19. The display substrate according to claim 18, wherein the plurality of sub-pixels further comprises a third sub-pixel, the second opening is provided between the first sub-pixel and the third sub-pixel, a distance between the edge of the light-emitting region of the first sub-pixel and the second opening is a third distance, a distance between the edge of the light-emitting region of the third sub-pixel and the second opening is a fourth distance, and the third distance is greater than the fourth distance; or, the defining structure further comprises a third defining structure, the third defining structure comprises a portion surrounding the light-emitting region of the third sub-pixel; the proportion of the edge length of the portion in the first defining structure that is exposed by the second opening to the perimeter of the first opening corresponding to the first sub-pixel is less than a proportion of an edge length of a portion in the third defining structure that is exposed by the second opening to a perimeter of the first opening corresponding to the third sub-pixel.

20. The display substrate according to claim 18, wherein a portion of the second defining structure that is exposed by the second opening is a non-closed ring structure, and a proportion of the non-closed ring structure to the perimeter of the first opening corresponding to the second sub-pixel ranges from 10% to 80%; and/or, a portion of the third defining structure that is exposed by the second opening is a non-closed ring structure, and a proportion of the non-closed ring structure to the perimeter of the first opening corresponding to the third sub-pixel ranges from 10% to 80%.

* * * * *